(12) United States Patent
Ibrahim et al.

(10) Patent No.: US 10,962,610 B2
(45) Date of Patent: Mar. 30, 2021

(54) ON-CHIP DETECTION OF SPIN STATES IN COLOR CENTERS FOR METROLOGY AND INFORMATION PROCESSING

(71) Applicant: Massachusetts Institute of Technology, Cambridge, MA (US)

(72) Inventors: Mohamed I Ibrahim, Cambridge, MA (US); Christopher Foy, Cambrdge, MA (US); Donggyu Kim, Cambridge, MA (US); Dirk Englund, Brookline, MA (US); Ruonan Han, Cambridge, MA (US)

(73) Assignee: Massachusetts Institute of Technology, Cambridge, MA (US)

(*) Notice: Subject to any disclaimer, the term of this patent is extended or adjusted under 35 U.S.C. 154(b) by 8 days.

(21) Appl. No.: 16/260,282

(22) Filed: Jan. 29, 2019

(65) Prior Publication Data
US 2019/0235031 A1    Aug. 1, 2019

Related U.S. Application Data

(60) Provisional application No. 62/729,212, filed on Sep. 10, 2018, provisional application No. 62/623,151, filed on Jan. 29, 2018.

(51) Int. Cl.
*G01R 33/00*    (2006.01)
*G01R 33/032*   (2006.01)
(Continued)

(52) U.S. Cl.
CPC ....... *G01R 33/032* (2013.01); *G01R 33/0094* (2013.01); *G01R 33/24* (2013.01);
(Continued)

(58) Field of Classification Search
CPC .... G01R 33/032; G01R 33/323; G01R 33/24; G01R 33/0094; G11C 13/06; G11C 13/04;
(Continued)

(56) References Cited

U.S. PATENT DOCUMENTS 9,551,763 B1    1/2017  Hahn et al.
9,766,181 B2    9/2017  Englund et al.
(Continued)

FOREIGN PATENT DOCUMENTS

WO    2017139683 A1    8/2017
WO    2017211504 A1    12/2017

OTHER PUBLICATIONS

International Search Report and Written Opinion in International Patent Application No. PCT/US2019/015511 dated Oct. 1, 2019, 17 pages.

(Continued)

*Primary Examiner* — Mohammed A Bashar
(74) *Attorney, Agent, or Firm* — Smith Baluch LLP

(57) ABSTRACT

The Zeeman shift of electronic spins in nitrogen-vacancy (NV) centers in diamond has been exploited in lab-scale instruments for ultra-high-resolution, vector-based magnetic sensing. A quantum magnetometer in CMOS utilizing a diamond-nanocrystal layer with NVs or NV-doped bulk diamond on a chip-integrated system provides vector-based magnetic sensing in a compact package. The system performs two functions for the quantum magnetometry: (1) strong generation and efficient delivery of microwave for quantum-state control and (2) optical filtering/detection of spin-dependent fluorescence for quantum-state readout. The microwave delivery can be accomplished with a loop inductor or array of wires integrated into the chip below the nanodiamond layer or diamond. And the wire array can also (Continued)

suppress excitation light using a combination of plasmonic and (optionally) Talbot effects.

19 Claims, 17 Drawing Sheets

(51) Int. Cl.
| | |
|---|---|
| *G06N 10/00* | (2019.01) |
| *G11C 13/06* | (2006.01) |
| *G01R 33/32* | (2006.01) |
| *G01R 33/24* | (2006.01) |
| *G11C 13/04* | (2006.01) |
| *H01L 23/528* | (2006.01) |
| *H01L 27/118* | (2006.01) |
| *G02B 5/20* | (2006.01) |
| *H01L 27/144* | (2006.01) |

(52) U.S. Cl.
CPC .......... *G01R 33/323* (2013.01); *G06N 10/00* (2019.01); *G11C 13/06* (2013.01); *G02B 5/20* (2013.01); *G11C 13/04* (2013.01); *H01L 23/528* (2013.01); *H01L 27/11807* (2013.01); *H01L 27/1443* (2013.01)

(58) Field of Classification Search
CPC ............ H01L 23/528; H01L 27/11807; H01L 27/1443
See application file for complete search history.

(56) References Cited

U.S. PATENT DOCUMENTS

| | | | | |
|---|---|---|---|---|
| 9,779,769 | B2* | 10/2017 | Heidmann | G11B 5/455 |
| 10,197,515 | B2 | 2/2019 | Clevenson et al. | |
| 2008/0048867 | A1 | 2/2008 | Oliver et al. | |
| 2013/0015850 | A1 | 1/2013 | Lindorfer et al. | |
| 2014/0077231 | A1 | 3/2014 | Twitchen et al. | |
| 2016/0161429 | A1* | 6/2016 | Englund | G01N 24/10 |
| | | | | 324/304 |
| 2017/0234941 | A1 | 8/2017 | Hatano et al. | |
| 2017/0343695 | A1* | 11/2017 | Stetson | G01R 33/032 |
| 2017/0363696 | A1 | 12/2017 | Hahn et al. | |
| 2017/0370979 | A1 | 12/2017 | Braje et al. | |
| 2018/0136291 | A1 | 5/2018 | Pham et al. | |

OTHER PUBLICATIONS

Balasubramanian et al., "Nanoscale imaging magnetometry with diamond spins under ambient conditions." Nature 455.7213 (2008): 648. 5 pages.

Charbon et al., "Cryo-CMOS circuits and systems for scalable quantum computing." Proc. 2017 International Solid-State Circuits Conference. 2017. 3 pages.

Clevenson et al., "Broadband magnetometry and temperature sensing with a light-trapping diamond waveguide." Nature Physics 11.5 (2015): 393. 8 pages.

Degen et al., "Quantum sensing." Reviews of modern physics 89.3 (2017): 035002. 45 pages.

Giovannetti et al., "Advances in quantum metrology." Nature photonics 5.4 (2011): 222.

Glenn et al., "High-resolution magnetic resonance spectroscopy using a solid-state spin sensor." Nature 555.7696 (2018): 351. 14 pages.

Hong et al., "Fully integrated fluorescence biosensors on-chip employing multi-functional nanoplasmonic optical structures in CMOS." IEEE Journal of Solid-State Circuits 52.9 (2017): 2388-2406.

Ibrahim et al., "Room-Temperature Quantum Sensing in CMOS: On-Chip Detection of Electronic Spin States in Diamond Color Centers for Magnetometry." 2018 IEEE Symposium on VLSI Circuits. IEEE, 2018, 2 pages.

Le Sage et al., "Optical magnetic imaging of living cells." Nature 496.7446 (2013): 486-489 (15 pages including supplementary materials).

Taylor et al., "High-sensitivity diamond magnetometer with nanoscale resolution." Nature Physics 4.10 (2008): 810-816 (8 pages including erratum).

Wang et al., "A light-field image sensor in 180 nm CMOS." IEEE Journal of Solid-State Circuits 47.1 (2012): 257-271.

\* cited by examiner

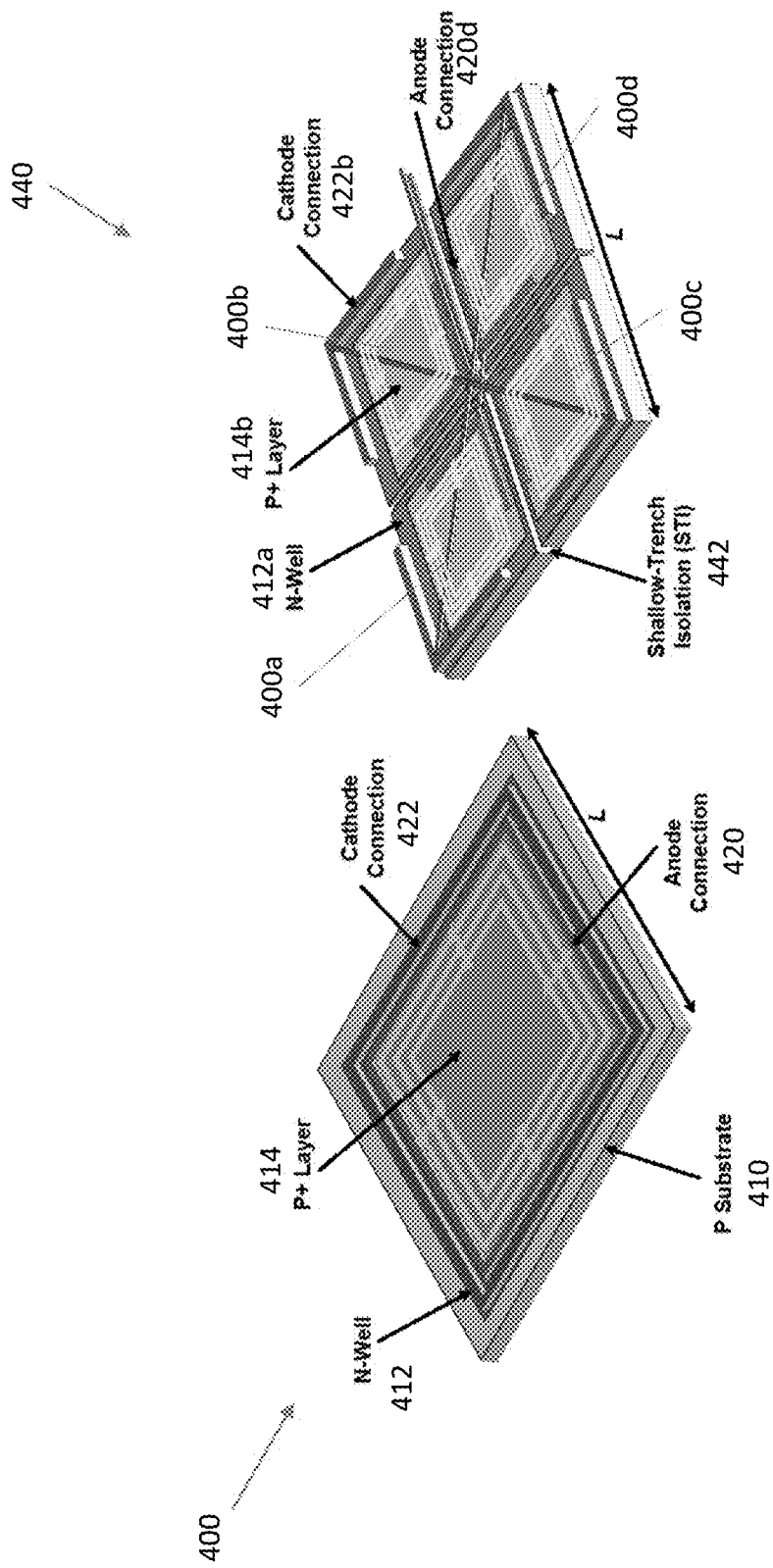

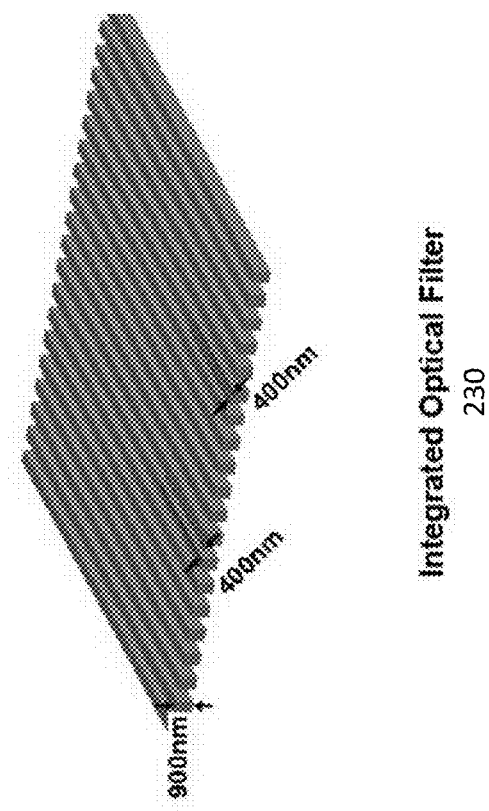
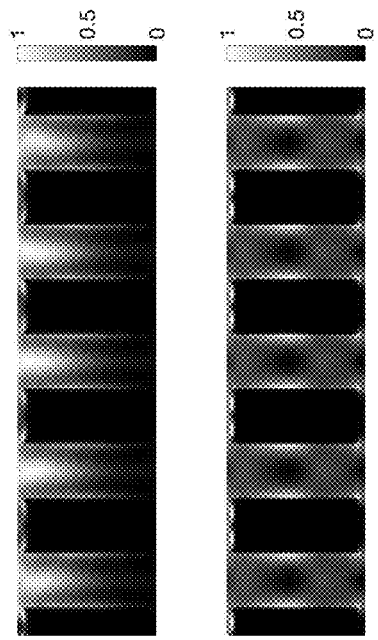
FIG. 5A
Integrated Optical Filter
230
FIG. 5B
(Top) Green Light, (Bottom) Red Light

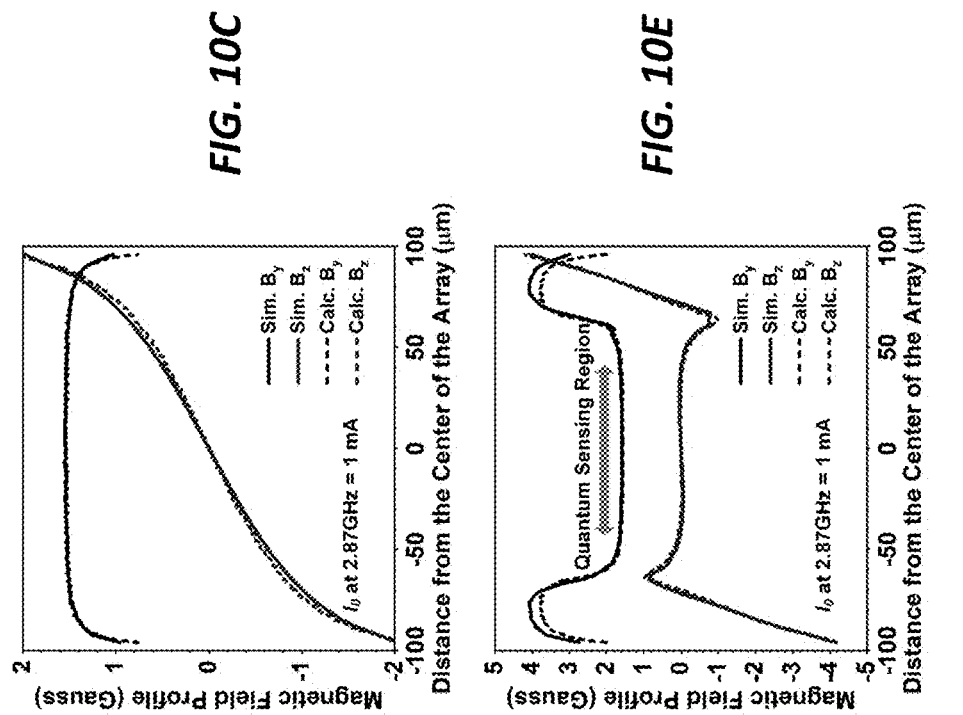
FIG. 10A  
FIG. 10B  
FIG. 10C
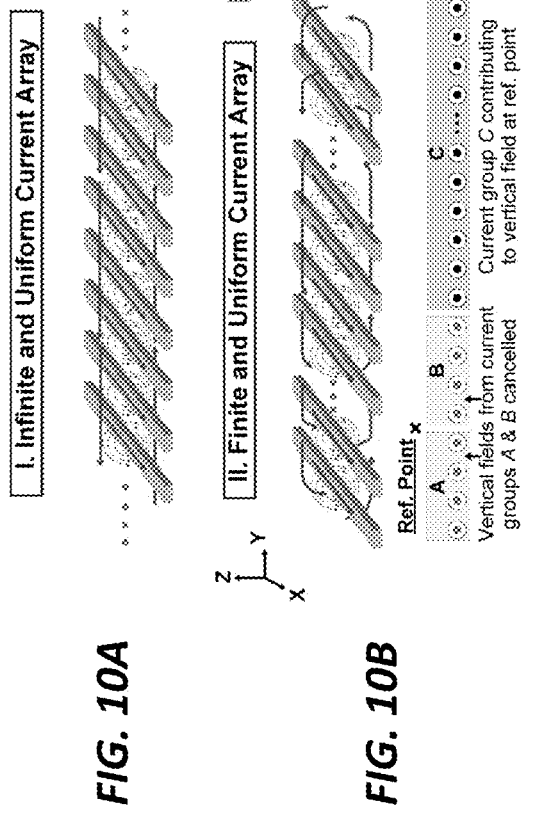
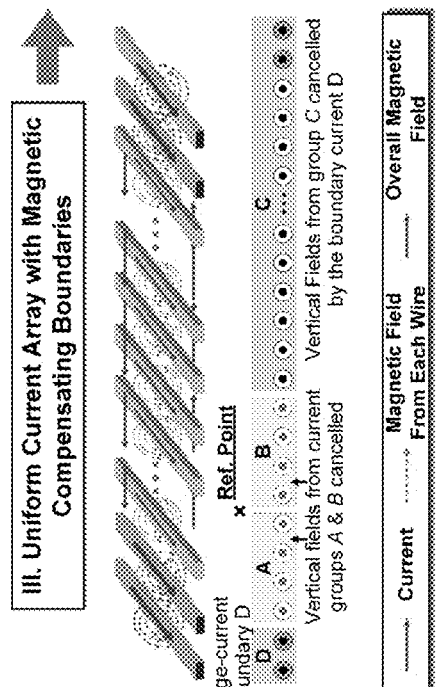
FIG. 10D  
FIG. 10E

ON-CHIP DETECTION OF SPIN STATES IN COLOR CENTERS FOR METROLOGY AND INFORMATION PROCESSING

CROSS-REFERENCE TO RELATED PATENT APPLICATIONS

This application claims priority, under 35 U.S.C. 119(e), to U.S. Application No. 62/729,212, filed Sep. 10, 2018, and to U.S. Application No. 62/623,151, filed on Jan. 29, 2018. Each of these applications is incorporated herein by reference in its entirety.

GOVERNMENT SUPPORT

This invention was made with Government Support under Grant No. W911NF-15-1-0548 awarded by the Army Research Office. The Government has certain rights in the invention.

BACKGROUND

Atom-like semiconductor spins are outstanding quantum platforms for metrology and information processing. For example, nitrogen vacancy (NV) centers have been extensively exploited for room-temperature sensors and quantum information processing in recent years. FIG. 1A shows a diamond lattice (right) with NV centers in four different orientations. Each NV center is a quantum site with a nitrogen atom and a vacancy that substitute for a pair of carbon atoms in the diamond lattice. Under microwave ($f_0$=~2.87 GHz) and green-light stimulation, an NV center's $m_s$=±1 spin state can be excited. The NV center emits red fluorescence in response to this excitation, leading to a dip in a plot of fluorescence intensity $I_f$ versus microwave frequency $f_0$.

FIG. 1B shows the energy-level diagram of an NV center. The NV center forms a spin triplet at its ground state, with a $|m_s=0\rangle$ state at its lowest energy and degenerate $|m_s=\pm1\rangle$ states raised by 2.87 GHz. An external magnetic field with a component $B_z$ along the N-V axis splits the $|+1\rangle$ and $|-1\rangle$ states by $2\gamma_e B_z$, ($\gamma_e$=28 GHz/T). Consequently, the NV spin resonance frequencies ($f_-$ and $f_+$) that drive these two spin states split from 2.87 GHz. The difference between $f_-$ and $f_+$ is proportional to $B_z$ and can be measured from optical detection of the magnetic resonances (ODMR). This optical detection is accomplished by exciting the NV centers with green excitation, resulting in red fluorescence minima at $f_-$ and $f_+$. In a bulk diamond, each of the four crystal lattice axes possesses a population of NV centers. To fully reconstruct an applied magnetic-field's direction and magnitude, its projections along each of the NV's axes are measured.

The plot in FIG. 1C is an example ODMR spectrum, complete with a dip in intensity at a frequency $f_0$. Because the frequency $f_0$ of the dip is sensitive to various physical conditions, including magnetic field, the NV center can be used for sensing. When an external magnetic field ($B_z$) is applied in the N-V direction of an NV center, the NV center's +1 and -1 spin states possess different resonance frequencies $f_0$, causing a dip split in the ODMR plot (the Zeeman effect) as shown in FIG. 1C. Because an NV center has four possible orientations in a diamond lattice, it is possible to align the magnetic field so that it produces four frequency splits for a total of eight dips in intensity disposed symmetrically about 2.87 GHz.

The magnitudes of these frequency splits are proportional to the projections of the magnetic field strength along each crystalline axis of the diamond lattice. The different frequency spacing allows the NV centers to perform vector magnetometry. The narrowness of each dip means that the NV center is very sensitive to magnetic field changes. The NV centers small sizes offers nanoscale spatial resolution. This nanoscale spatial resolution is possible due to nanometer-scale electronic wavefunction of NV centers.

Typically, a permanent magnet or electromagnet applies a bias magnetic field of known amplitude and orientation to the NV defects. This bias magnetic field causes the NV centers' resonances to split as shown in FIG. 1C. Subjecting the NV centers to an unknown environmental quantity (e.g., magnetic field, electric field, or temperature) causes the resonances to shift in frequency, according to the ground spin Hamiltonian.

Moreover, NV centers are also used for quantum information processing based on their outstanding spin properties: (i) long spin coherence time even in ambient conditions and (ii) optical interfaces for efficient spin state preparation and measurement with high spatial resolution. Combined with nearby nuclear spins, NV centers provide as quantum memories where quantum information is stored and manipulated.

SUMMARY

Embodiments of the present technology include an apparatus for measuring an external magnetic field or other external stimulus. This apparatus includes a semiconductor integrated circuit, a crystal host (e.g., diamond) disposed on the semiconductor integrated circuit and comprising a plurality of color centers (e.g., nitrogen vacancies), an inductor formed in at least one layer of the semiconductor integrated circuit, and a photodetector integrated in the semiconductor integrated circuit in optical communication with the plurality of color centers. In operation, the inductor applies an alternating current (AC) magnetic field to the plurality of color centers. And the photodetector detects fluorescence emitted by the plurality of color centers in response to the external magnetic field.

The inductor may include at least one parasitic disconnected loop (also called a broken loop) to enhance uniformity of the AC magnetic field. The inductor may include or be a resonant inductor, in which case the photodetector may be patterned to reduce eddy currents in the photodetector. The photodetector may include several photodiodes, including a first photodiode having a first anode and a first cathode and a second photodiode having a second anode in electrical communication with the first anode and a second cathode in electrical communication with the first cathode.

This apparatus may also include a filter integrated in or above the semiconductor integrated circuit in optical communication with the plurality of color centers and the photodetector. This filter transmits the fluorescence and blocks light at other wavelengths. The apparatus may also include a signal generator, integrated in the semiconductor integrated circuit and operably coupled to the inductor, to drive the inductor with a current that induces the AC magnetic field. It may include circuitry, formed in the semiconductor integrated circuit, to process a signal emitted by the photodetector in response to the fluorescence. And it may include a light source, in optical communication with the plurality of color centers, to excite the plurality of color centers with light. If so, a prism, disposed on the semiconductor integrated circuit in optical communication with the light source and the plurality of color centers, can evanescently couple the light into the crystal host and/or reject background light.

Another embodiment is an apparatus for measuring an external magnetic field that includes a complementary metal-oxide-semiconductor (CMOS) integrated circuit, a solid-state host disposed on the CMOS integrated circuit and comprising a plurality of color centers, an inductor, a signal generator, and a photodetector. The inductor, signal generator, and photodetector are integrated into the CMOS integrated circuit. In operation, the signal generator applies a current to the inductor. This current induces an alternating current (AC) magnetic field in the inductor, which includes at least one parasitic disconnected loop that increases a uniformity of the AC magnetic field, across the nitrogen vacancies. The photodetector, which is patterned to reduce eddy currents, detects fluorescence emitted by the plurality of color centers in response to the external magnetic field.

Another embodiment is a magnetic (field) imager comprising an array of magnetic field sensors disposed on an integrated circuit. Each of these magnetic field sensors comprises a crystal host with color centers, an inductor formed in a layer of the integrated circuit around the crystal host, and a photodetector. The inductor applies an AC magnetic field to the color centers. And the photodetector detects fluorescence emitted by the color centers in response to an external magnetic field. This magnetic imager may also include circuitry, formed in the integrated circuit, that processes a signal emitted by the photodetector in response to the fluorescence.

Another magnetic field sensor includes a semiconductor integrated circuit (e.g., a CMOS integrated circuit), a crystal host on the semiconductor integrated circuit, an array of metal wires formed in a layer of the semiconductor integrated circuit, and a photodetector integrated in the semiconductor integrated circuit in optical communication with the plurality of color centers and the array of wires, to detect the fluorescence. The crystal host contains color centers that emit fluorescence in response to an external magnetic field. The array of metal wires applies an AC magnetic field to the color centers and forms a metal grating to transmit the fluorescence and filter light at other wavelengths. And the photodetector detects the fluorescence.

The array of metal wires may include current-carrying wires to carry alternating current that induces the AC magnetic field and non-current-carrying wires. The metal grating in the array of metal wires may be a first metal grating, with a first grating period, in a first layer of the semiconductor integrated circuit. In this case, the array of metal wires may include a second metal grating, having a second grating period equal to the first grating period, in a second layer of the semiconductor integrated circuit, wherein the second metal grating is laterally offset from the first metal grating by about half the first grating period. For a CMOS integrated circuit, the first layer is an M8 layer of the CMOS integrated circuit and the second layer is an M6 layer of the CMOS integrated circuit. The array of metal wires may further include a third metal grating, having a third grating period equal to the first grating period and the second grating period, in an M3 layer of the CMOS integrated circuit. This magnetic field sensor may also include an AC current source, in electrical communication with the array of wires, to apply the alternating current to the current-carrying wires with a non-uniform distribution selected to induce the AC magnetic field with a uniform amplitude across the color centers.

Yet another embodiment is a memory for a quantum computer or quantum repeater. This memory may include an array of qubit storage nodes disposed on an integrated circuit. Each of these qubit storage nodes may include a crystal host on the integrated circuit and an inductor, an electric field source, and a photodetector formed in or on the integrated circuit. The crystal host comprises color centers that emit fluorescence in response to an AC magnetic field applied by the inductor and/or in response to an electric field applied by the electric field source. The photodetector detects fluorescence emitted by the color centers in response to the AC magnetic field and/or the electric field.

All combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. Terminology explicitly employed herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 4A shows a schematic of a conventional photodiode suitable for use in an integrated NV sensor.

FIG. 4B shows a schematic of a patterned photodiode suitable for use in an integrated NV sensor.

FIG. 5A is a schematic of an optical long-pass filter suitable for use in an integrated NV sensor.

FIG. 5B is a plot of simulated transmission of the optical filter of FIG. 5A for green (excitation) light (top) and red (fluorescent) light (bottom).

FIGS. 10A-10G illustrate on-chip current-driven arrays for high-uniformity magnetic field generation in the NV-based CMOS magnetometer of FIG. 9 and their simulated magnetic field profiles.

DETAILED DESCRIPTION

Unfortunately, existing NV-based sensing platforms have bulky and discrete instruments to control and measure spin states, which makes them impractical and difficult to scale up for advanced quantum-enhanced sensing protocol. The inventive technology addresses this challenge through integration of a single-chip spin-control/detection system using standard complementary metal-oxide-semiconductor (CMOS) fabrication processes. Through a tightly-integrated microwave launcher, photonic filter, and sensor, the CMOS circuit offers more direct physical interactions with the quantum states, rather than being simply utilized as an electronic input/output (I/O) module. This enables an ultra-compact and highly-scalable platforms for quantum sensing and potentially information processing under cryogenic condition.

1 AN INTEGRATED QUANTUM SENSING SYSTEM WITH A DISCONTINUOUS INDUCTIVE LOOP

Figure 2:
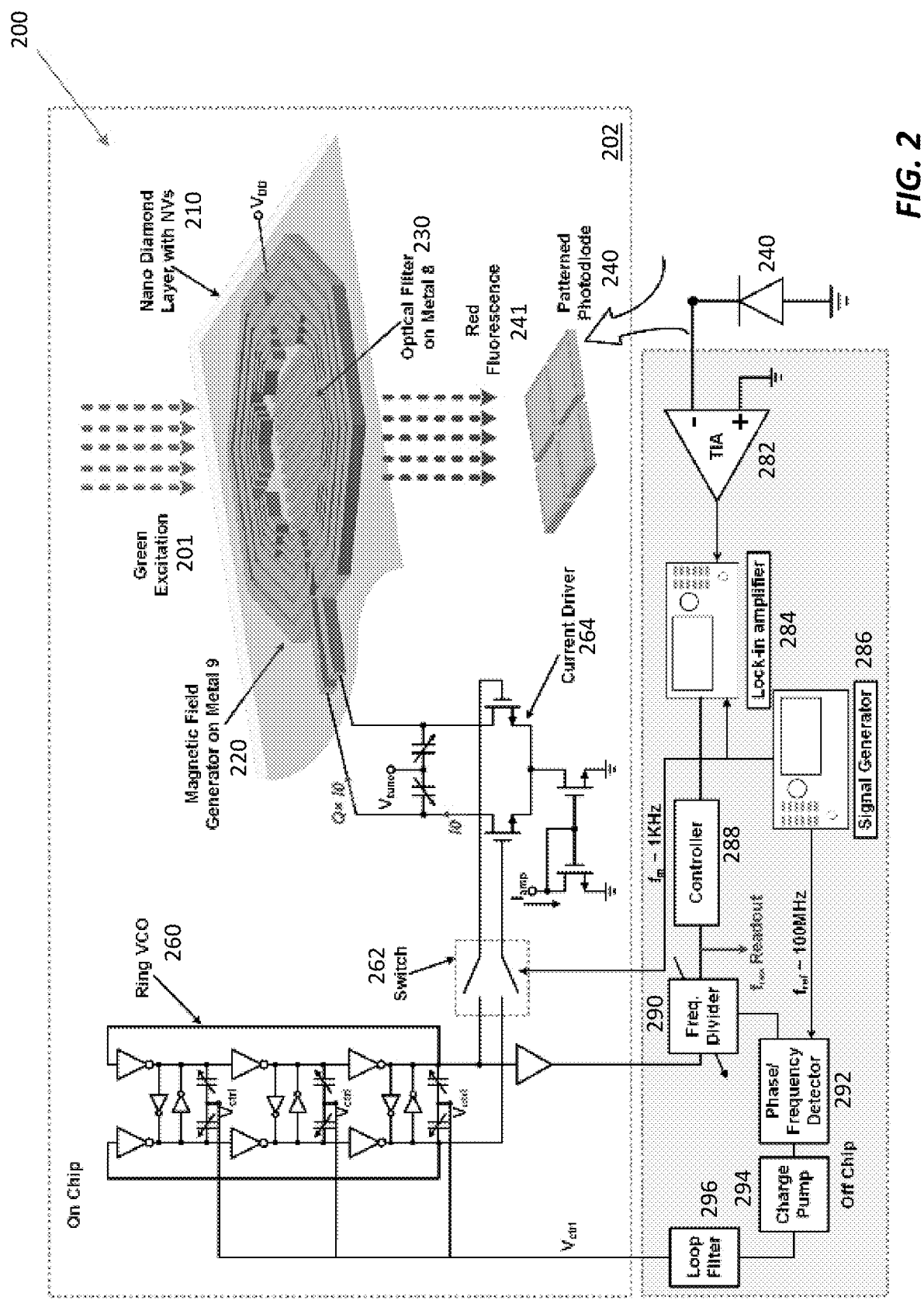
FIG. 2 shows a circuit schematic of an integrated NV-based magnetic sensor using a 65 nm CMOS technology.

FIG. 2 shows an integrated, NV-based sensor 200 that can be used to measure external magnetic fields, external electric fields, or temperature. The sensor 200 includes an NV-doped nanodiamond layer 210 on an integrated circuit 202 with a microwave generator (here, an inductor in the form of an on-chip inductor 220 with multiple broken or discontinuous loops) and an optical filter 230 formed in different metal layers (metal 9 and metal 8, respectively) of the integrated circuit 202. This microwave generator subjects the NV centers to an alternating current (AC) magnetic field, also referred to here as a microwave field because it may be at microwave frequencies. For the excitation of the $m_s=\pm 1$ spin states, the NV centers in the nanodiamond layer 210 are subjected to a 2.87 GHz AC magnetic field with an amplitude of up to 10 Gauss (stronger fields are also possible and may improve performance). In other NV-based magnetometers, this is achieved by external coils or wires driven by a large alternating current (AC).

Thanks to the close proximity between the chip 202 and the NV centers in the nanodiamond layer 210, per Ampere's Law, the on-chip, multi-loop inductor 220 can produce a high enough microwave field amplitude in response to current from an on-chip ring voltage-controlled oscillator (VCO) 260 and current driver 264 via a switch 262. A pair of shunt capacitors coupled to the output of the current driver 264 forms a resonance near 2.87 GHz; the AC magnetic field amplitude is therefore amplified by a factor Q with the same driver current (~5 mA), where Q (~15) is the quality factor of the inductor 220.

The sensor 200 includes an on-chip photodetector, such as a $p^+$/n-well patterned photodiode 240 (e.g., avalanche photodiodes), placed inside the perimeter of the inductor 220 to detect red fluorescence 241 emitted by the excited NV centers. The photodiode 240 is coupled to a lock-in amplifier 284 via a transimpedance amplifier (TIA) 282. The lock-in amplifier 284 receives a reference carrier wave from the ring VCO 260 via a frequency divider 290 and a controller 288. The lock-in amplifier 284 and the microwave switch 262 receive a reference carrier wave from an external signal generator 286 that causes modulation at 1 kHz. The signal generator 286 also controls the ring VCO 260 via a phase/frequency detector 292, charge pump 294, and loop filter 296. As shown in FIG. 2, the TIA 282, lock-in amplifier 284, signal generator 286, controller 288, frequency divider 290, phase/frequency detector 292, charge pump 294, and loop filter 296 may be discrete components located off-chip.

The microwave/AC magnetic field across the NVs in the nanodiamond layer 210 should be highly uniform to enhance the coherency of the ensemble of NVs and/or drive magnetic transitions of multiple NV centers in phase. To this end, the inductor 220 includes a set of broken parasitic loops that can be formed in one or more metal layers of the integrated circuit 202. FIG. 3A shows three different loop inductor designs superimposed on a plot of magnetic field amplitudes versus distance from the center of the loops. The center loop inductor has a loop with a single break and the least uniform field amplitude (top trace). The left-hand loop inductor includes an outer loop with a single break that carries current counterclockwise is coupled to an unbroken inner loop that carries current clockwise. The left-hand inductor has the most uniform field amplitude, but the amplitude is five times lower for the same drive current (bottom trace). The right-hand loop inductor includes an outer loop with a single break that carries current counterclockwise is coupled with an inner loop with six breaks that carries current clockwise. This configuration produces a field that is stronger than the left-hand inductor and more uniform than the center inductor (middle trace).

Figure 3B:
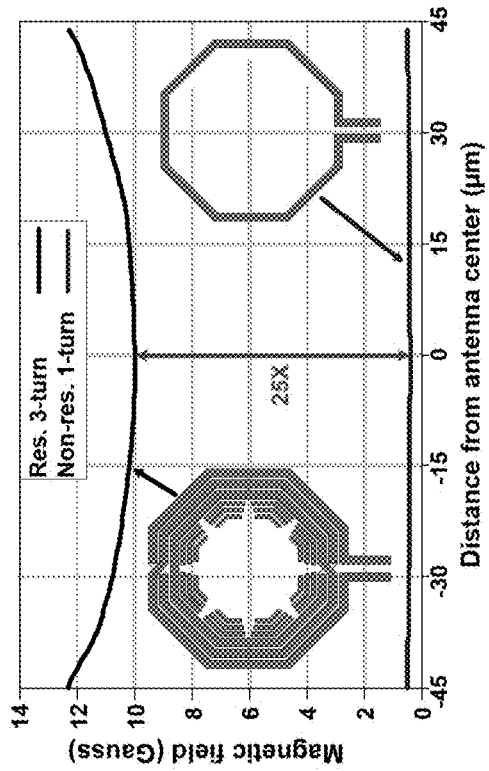
FIG. 3B shows diagrams and plots of magnetic field amplitude versus distance from inductor center for an inductor with three continuous and discontinuous loops (left, upper trace) and a single continuous loop (right, lower trace).
Figure 3A:
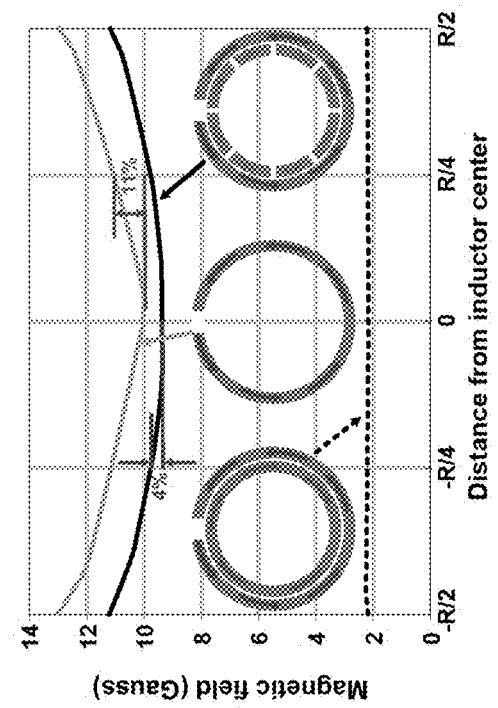
FIG. 3A shows different loop inductors overlaid on a plot of magnetic field amplitude versus distance from inductor center for each loop inductor.

FIG. 3B shows a more sophisticated octagonal inductor with a three-turn loop concentric with three disconnected loop sections that are capacitively coupled to each other and/or the three-turn loop (left). The magnetic field generated by the induction currents in these capacitively coupled loop sections counteracts the field from the outer three-turn loop at the loop edge, thus improving the overall field uniformity to >95%. Compared to a single-turn, non-resonant inductor (right), the more sophisticated octagonal resonant inductor generates a field that is over ten time stronger.

FIGS. 4A and 4B illustrate different types of photodetectors suitable for use in the magnetometer of FIG. 2. FIG. 4A shows a single-pixel p+/n-well photodiode 400 with a p-doped substrate 410 that supports an n-doped well 412 and a p+-doped layer 414. The photodiode 400 has an anode connection 420 and a cathode connection 422 and is disposed inside the inner perimeter of the inductor 220 shown in FIG. 2.

Unfortunately, placing the photodiode 240 inside the inner perimeter of the inductor 220 creates deleterious eddy currents in the photodiode 400. Since the photodiode 400 includes conductive silicon layers, the inductor 220 (FIG. 2) may induce a large eddy current (indicated by arrows in FIG. 4A) near 2.87 GHz in the silicon layers. This eddy current leads to large loss and reduces the Q (and hence the magnetic field strength) of the inductor 220. For a square photodiode with dimensions of L×L, the power loss is proportional to $L^3$.

Patterning the photodetector's active layer into parts separated by shallow trenches reduces the eddy current. FIG. 4B shows a patterned photodetector 440 with shallow-trench isolation (STI) 442 between the parts, labeled 400a-400d (each part 400 has its own n-doped well 412, p+-doped layer 414, anode connection 420, and cathode connection 422, where the anode and cathode connections are implemented in a way that prevents closed loops). Patterning the photodetector 440 into four parts separated by STI 442 reduces the total loss by $L^3/[4·(L/2)^3]=2$. This patterning is similar to the patterned ground shield used in the on-chip inductor 220; further photodetector partitioning should provide extra loss reduction. Even with patterning, the responsivity of the photodiode 440 can be at least 0.23 A/W.

Referring again to FIG. 2, placing the photodiode 240 so close to the nanodiamond layer 210 creates another challenge: detecting on-chip red fluorescent light 241 in the presence of high-intensity green light 201 (532 nm) used to pump or excite the NV centers in the nanodiamond layer 210. This green light 201 may be evanescently coupled into the nanodiamond layer 210 via a prism (not shown) on the semiconductor integrated circuit 202 that also rejects background light. The green light 201 significantly lowers the contrast and increases shot noise of the measured ODMR.

The integrated optical filter 230 shown in FIGS. 2 and 5A addresses this challenge by filtering the green light 201 and transmitting the red fluorescent light 241 to the photodiode 240. The optical filter 230 includes a periodic grating structure formed in the M8 layer of the integrated circuit 202. Its period and thickness depend on the shape, bandwidth, and center wavelength of the desired passband. With a period of 400 nm and a thickness of 900 nm, as shown in FIG. 5A, the filter 230 provides about 10 dB of green-light suppression by coupling the incident green light 201 into a lossy surface plasmon polariton mode. In contrast, photons of spin-dependent red fluorescence 241 pass through the grating structure in the M8 layer with a transmission of 0.96.

FIG. 5B shows finite-difference time-domain (FDTD) simulations of the intensity profiles at the wavelengths of 532 nm (upper plot; green light 201) and 700 nm (lower plot; red fluorescent light 241). The intensity profiles are side views of the sensor 200 along the cross section of the filter 230 in FIG. 2. The green light and red light couple into the metal grating 230 from above. While they propagate through the grating, the metal absorbs much more green light than red light.

Figure 6:
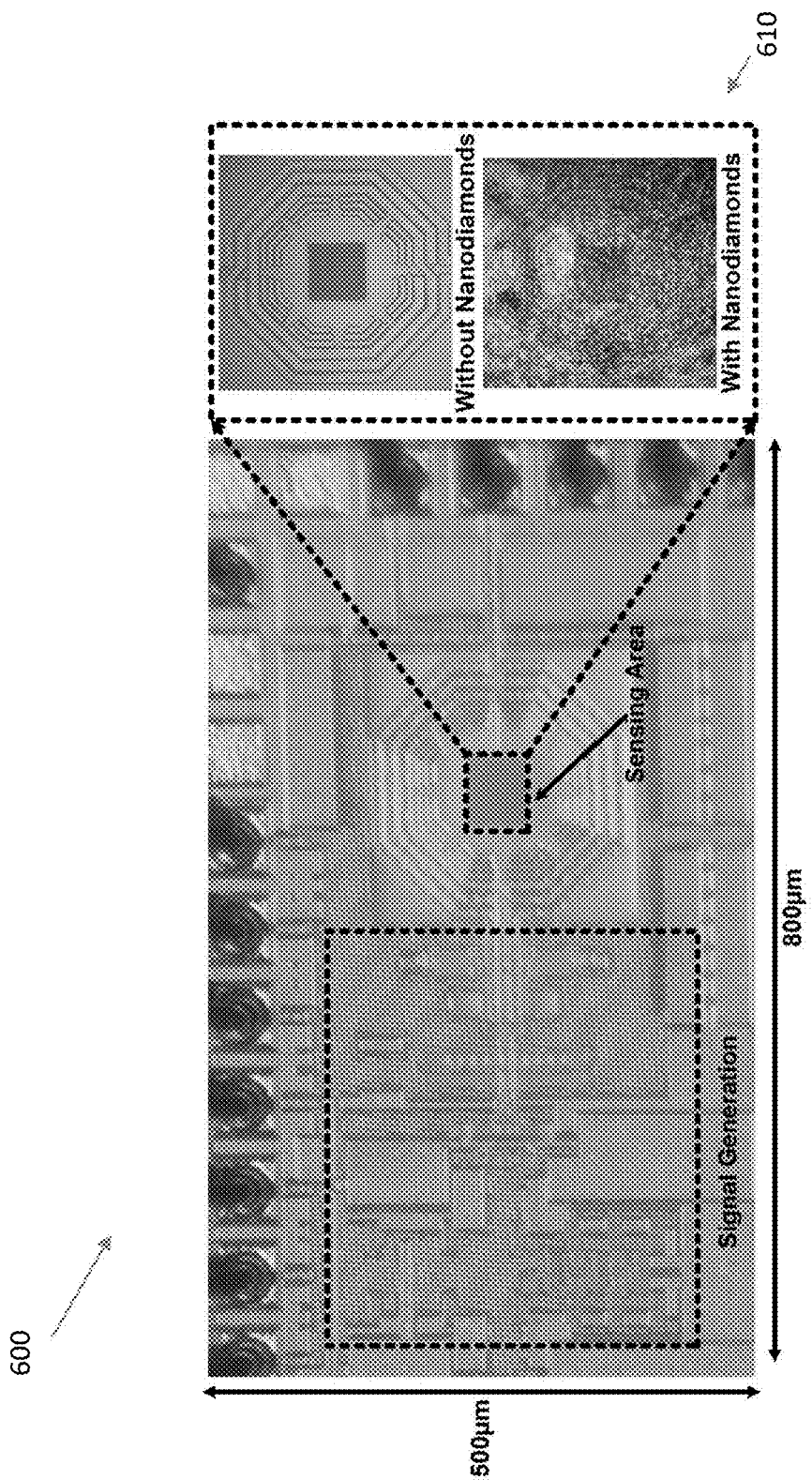
FIG. 6 shows a photograph of an integrated NV sensor, with close-ups of the sensing area with (top) and without (bottom) nanodiamonds.

FIG. 6 shows an integrated magnetic sensor chip 600 that was implemented using a 65 nm bulk CMOS technology. To deposit the diamond nanocrystals with NV ensembles on the chip 600, the chip passivation layer was etched using $CF_4$ plasma. (The chip passivation layer may emit unwanted background red fluorescence.) Next, a drop of nanodiamond solution was applied on the treated chip surface. After drying, the nanodiamonds are deposited onto the chip 600 to form a nanodiamond layer 610 as shown in the insets at right in FIG. 6.

Figures 7A, 7B:
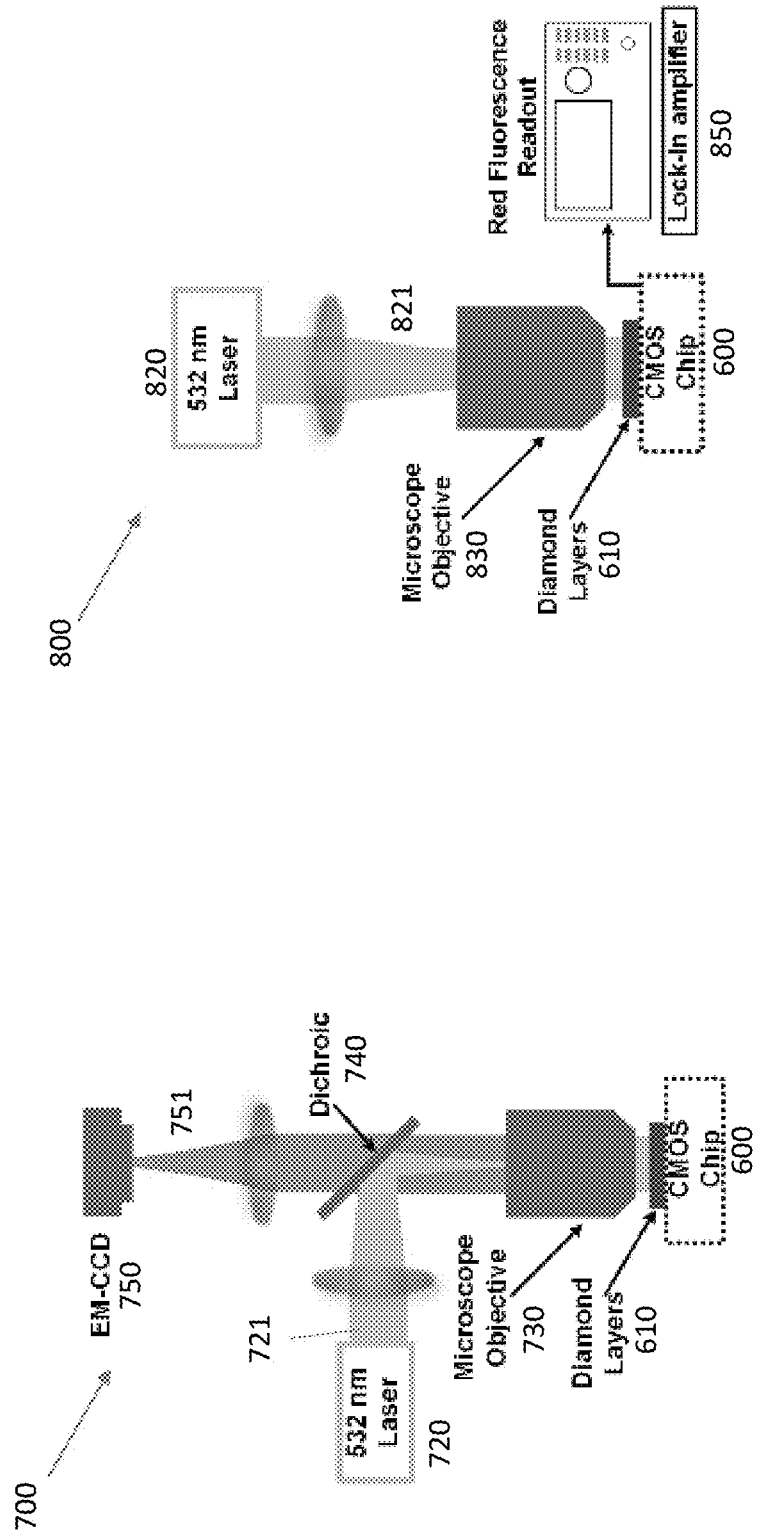
FIG. 7A shows a setup for testing an integrated NV sensor with an off-chip camera.
FIG. 7B shows a setup for testing an integrated NV sensor with the on-chip photodiode.

FIG. 7A shows a test setup 700 used to test the chip 600 pictured in FIG. 6 with a green laser 720 and an off-chip detector (here, an electron-multiplying charge coupled device (EM-CCD) 750. The laser 720 emits an excitation beam 721 that reflects off a dichroic mirror 740 to a microscope objective 730, which focuses the excitation beam 721 on the nanodiamond layer 610. The chip 600 excites the NV centers in the nanodiamond layer 610 with a microwave excitation signal that is amplitude modulated at a modulation frequency of $f_m=1$ kHz. The NV centers in the nanodiamond layer 610 respond to the excitation beam 721 and microwave excitation by emitting fluorescent light 751 in all directions. The microscope objective 730 collects a portion of this fluorescent light 751, which propagates through the dichroic mirror 740 and is detected by the EM-CCD 750.

FIG. 7A shows a test setup 800 used to test the chip 600 pictured in FIG. 6 with a green laser 820 and an on-chip photodetector. The laser 820 emits an excitation beam 821 that is focused by a microscope objective 830 on the nanodiamond layer 610. The chip 600 drives the NV centers in the nanodiamond layer 610 with a microwave excitation signal that is amplitude modulated at a modulation frequency of $f_m=1$ kHz. The NV centers in the nanodiamond layer 610 respond to the excitation beam 821 by emitting fluorescent light in all directions. The on-chip detector senses a portion of this fluorescent light, generating a photocurrent that is detected with a lock-in amplifier 850.

Figure 8B:
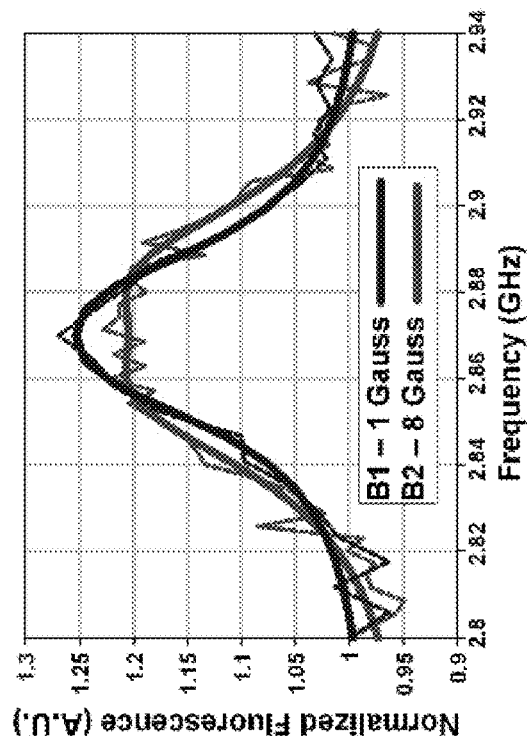
FIG. 8B shows measured and fitted ODMR spectra acquired using the test setup of FIG. 7B.
Figure 8A:
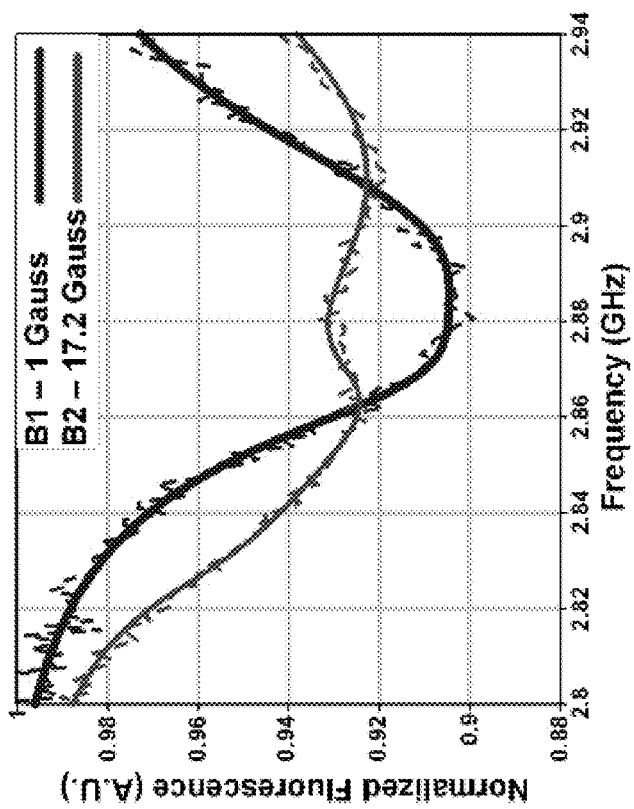
FIG. 8A shows measured and fitted ODMR spectra acquired using the test setup of FIG. 7A.

FIGS. 8A and 8B show ODMR spectra for different external magnetic fields as measured with the setups of FIGS. 7A and 7B, respectively. Sweeping the frequency of the microwave excitation generated by the chip 600 while measuring the photocurrent emitted by the detector yields the ODMR spectra. FIGS. 8A and 8B show the Zeeman effect at an external static magnetic field of 17.2 Gauss. Since the crystal orientation of the nanodiamond layer 610 was random, the effective magnetic field $B_z$ experienced by each orientation (and hence the amount of splitting) continuously varied, so FIGS. 7B and 8B show spectral broadening, rather than splitting, was observed. Replacing the nanodiamond layer 610 with a single-crystal diamond doped with NVs reduces the ODMR linewidth, giving discrete resonances from the differently oriented NV ensembles and boosting sensitivity.

2 AN INTEGRATED NV-BASED QUANTUM SENSING SYSTEM WITH A METAL WIRE ARRAY

Figure 9:
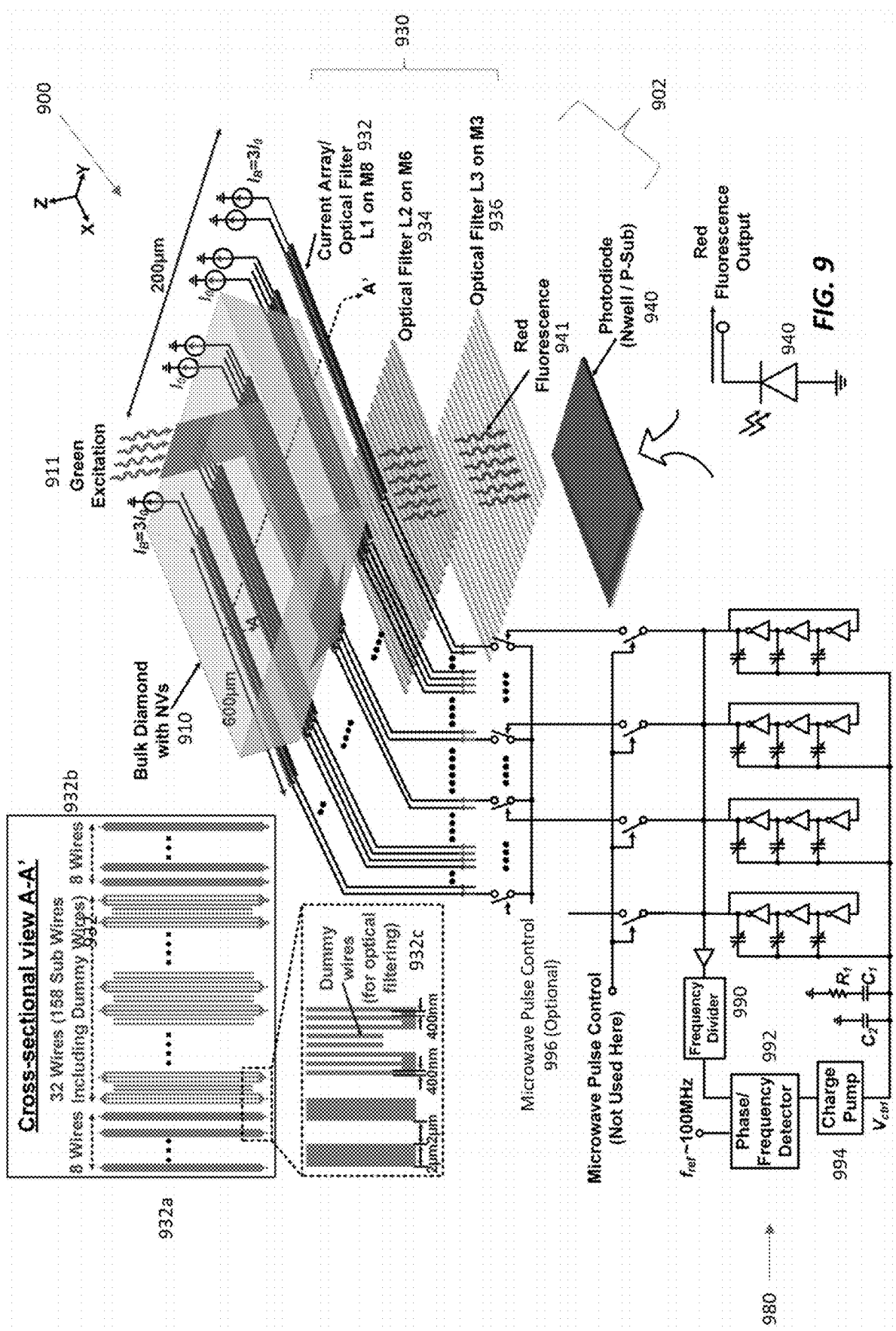
FIG. 9 shows a NV-based CMOS magnetometer with an on-chip, current-driven wire array that applies a microwave/AC magnetic field to the NV centers and filters fluorescent light.

FIG. 9 shows an integrated NV-based quantum sensing system 900, also called a CMOS quantum sensor, with a metal wire array 930 that acts as both a highly scalable microwave-delivering structure and the first layer of the surface plasmon polarization-based photonic filter with enhanced green-to-red suppression ratio. The former enables coherent driving of an increased number of NV centers, and the latter reduces the shot noise of the system's photodetector 940 caused by green laser light 911 used to excite the NV centers.

The system 900 can operate as a vector magnetometer that can be used for measuring and tracking magnetic objects and for navigation. It can operate with a measured vector-field sensitivity of 245 nT/√Hz. The system 900 includes bulk crystalline host, such as a diamond 910, that is doped with spatially distributed color centers, such as NV centers. The diamond 910 is on a multi-layer integrated circuit 902 that includes the wire array 930 as well as circuitry 980 for generating the microwave excitation delivered by the wire array 930 and components for detecting and processing fluorescent light 941 emitted by the NV centers.

The circuitry 980 for generating and switching microwave signals includes an on-chip phase-locked loop (PLL) with a frequency divider 990, a phase/frequency detector 992, a charge pump 994, and optional microwave pulse control switches 996, which can be used to switch the PLL output on and off more quickly than switching the PLL on and off. This circuitry 980 generates microwave signals at about 2.87 GHz to coherently excite the spin states of the NV centers. The circuitry 980 is coupled to the wires in the metal wire array 930 and delivers the microwave signals to those wires.

The circuitry 980 can be used to modulate the microwave signals coupled to the wires as follows. Changing the division ration of the PLL or the input reference to the PLL changes the frequency of the microwave signals. The phase of the microwave signals can be controlled by an IQ generator (not shown) that generates an arbitrary phase signal. And the amplitude of the microwave signals can be controlled by amplifying or attenuating the AC current coupled to the wires in the metal wire array 930.

Figure 11A:
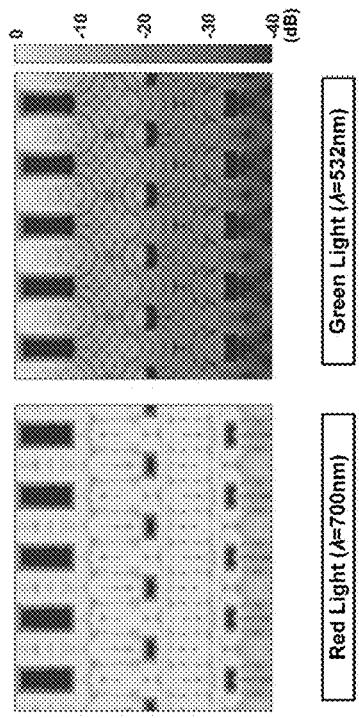
FIGS. 11A-11D illustrate the design and simulated performance of a multi-layer integrated optical filter suitable for use in the NV-based CMOS magnetometer of FIG. 9.
Figure 11B:
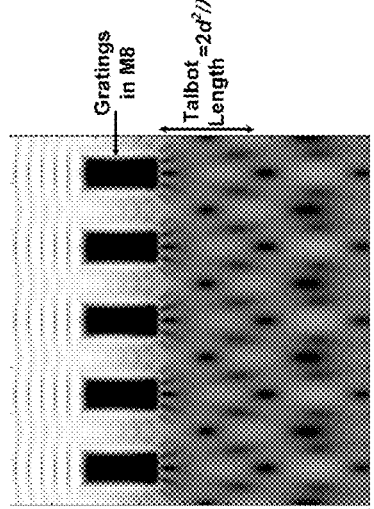

The metal wire array 930 includes three sub-arrays 932, 934, and 936 in different layers of the integrated circuit 902: the first sub-array 932 is in the metal 8 (M8) layer, the second sub-array 934 is in the metal 6 (M6) layer, and the third sub-array is in the metal 3 (M3) layer. The sub-arrays may have the same pitch, but may be offset laterally from each other, e.g., so that the wires in the first sub-array 932 and third sub-array 936 are aligned with each other and the wires in the second sub-array 934 are offset from the wires in the other sub-arrays 932 and 936, e.g., as shown in FIG. 11B. As explained in greater detail below, the wires in the array may have the same width or different widths, depending in part on the current running through them.

The first sub-array 932 includes current-driven wires 932a and 932b and dummy wires 932c as shown in the cross-sectional view in the inset of FIG. 9. The current-driven wires 932a and 932b are used to synthesize a highly uniform magnetic field in the lateral direction ($B_Y$) with respect to the chip's surface. This is because an infinite array of uniform wires carrying a uniform current ($I_0$) produces a homogeneous transverse magnetic field as shown in FIG. 10A. As shown in FIGS. 10B and 10C, however, a finite number of current-driven wires produces a field in the vertical direction $B_z$ is no longer fully cancelled and increases towards the array edges. To recover field homogeneity, a few additional wires carrying current larger than $I_0$ are placed on the edges of the array as shown in FIG. 10D, providing a ramp-up profile of $B_z$ that cancels the aforementioned vertical field across a wide range of wire array as shown in FIG. 10E.

Figure 10G:
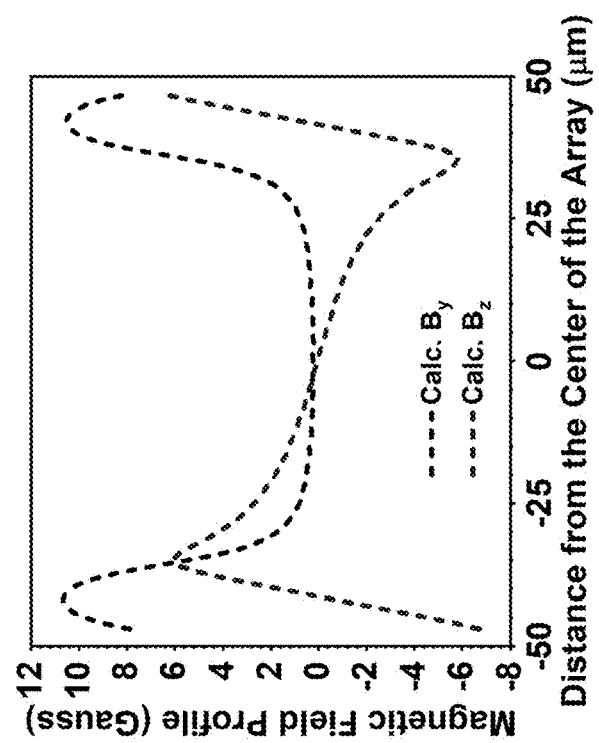
Figure 10F:
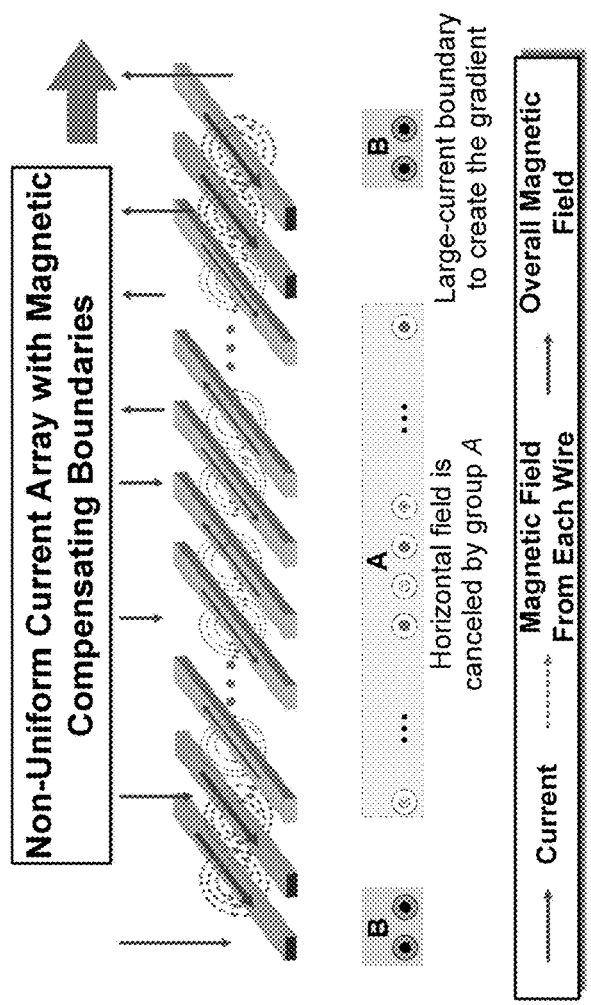

The first sub-array 932 can also generate different field profiles by controlling the currents running through the wires in the first sub-array 932, e.g., as shown in FIGS. 10F and 10G, which are described below. For example, increasing the current at the edges of the array cancels at least a portion of the field in the vertical direction $B_z$. The first sub-array 932 can generate a polynomial field profile in Z direction, while maintaining zero field in Y direction in the middle of the array.

In the sensor 900 of FIG. 9, the first sub-array 932 includes 32 uniform-current-driven wires 932a ($I_0$=0.5 mA) and eight field-compensating wires 932b ($I_B$=3 $I_0$) at each edge of the sub-array 932. The uniform-current-driven wire spacing is chosen based on the desired field strength and uniformity, which may result in a spacing that does not match the desired grating pitch for filtering green light 901 as explained below. To compensate, the first sub-array 932 includes dummy wires 932c spaced between the uniform-current-driven wires 932a at the grating pitch. These dummy wires 932c don't carry current, but they are spaced so that they act in concert with the uniform-current-driven wires 932a to diffract green light 901 as described below with respect to FIGS. 11A-11D. In addition, each wire in the first sub-array 932 may be divided into connected sub-wires for the same reason.

As shown in the electromagnetic (EM) simulations and Ampere's law calculations in FIG. 10E, the field-compensating wires 932b simultaneously improve the uniformity of the transverse field $B_Y$ and reducing the vertical field $B_z$ close to zero across the diamond 910. The wire currents are regulated by a bank of current sources gated by the PLL output signal. To prevent phase variation of the microwave currents along the Y-axis, the VCO of the PLL is based on a bank of coupled ring oscillators, which are uniformly placed along the Y-axis. The phase noise is subsequently decreased, too.

The NV centers in the diamond 910 emit red fluorescent light 941 is response to the microwave excitation delivered by the sub-array 932 and the incident green light 901. A photodetector 940 that is coupled to a TIA (not shown) and situated below the diamond 910 and the wire array 930 detects this red fluorescent light 941. This photodetector 940 can be implemented as a detector array, such as an array of CMOS imagers. Unfortunately, the incident green light 901 has a much higher intensity than the red fluorescence 941 and adds shot noise at the photodetector output. The wire array 930 filters away the green light 901 and transmits the red fluorescent light 941 using the wavelength-dependent Talbot effect as explained below.

FIGS. 9 and 11B show that the sub-arrays 932, 934, and 936 form metal gratings at different layers within the integrated circuit 902 between the diamond 910 and the photodetector 940. The exact number of sub-arrays depends on the available number of metal interconnect layers in the integrated circuit. Light incident upon each grating generates a diffraction pattern, where the intensity maxima and minima repeat between sub-arrays (i.e., in the vertical direction in FIGS. 11A and 11B) with a wavelength-dependent Talbot length $2d^2/\lambda$ as shown in FIG. 11A, where d is the grating period and $\lambda$ is the wavelength. Optimally, this means that the spacing between each pair of sub-arrays (metal gratings) should be an integer multiple of the wavelength-dependent Talbot length (i.e., $n2d^2/\lambda$, where n is a positive integer). Another possibility is to use fractional values of the Talbot length ($2d^2/m\lambda$), where m can have values 1, 2, 3, or 4 and the periodicity of the sub-array can be modified. The spacing between these layers does not need to be uniform—for example, the first and second sub-arrays 932, 934 could be separated by $4d^2/\lambda$, whereas the second and third sub-arrays 934, 936 could be separated by $2d^2/\lambda$.

Aligning the second sub-array 934 (in M6) in positions to the maxima for green light 901 and minima for red light 941 in the diffraction pattern for the first sub-array 932 as shown in FIG. 11B filters green light 901 while transmitting red light 941. Similarly, aligning the third sub-array 934 (in M3) in positions to the maxima for green light 901 and minima for red light 941 in the diffraction pattern for the second sub-array 934 filters even more green light 901 while transmitting red light 941. Thus, the wire array configuration shown in FIG. 11B rejects the green light 901 via Talbot imaging in addition to the plasmonic filtering via thick M8 grating layer (i.e., the first sub-array 932).

Figure 11C:
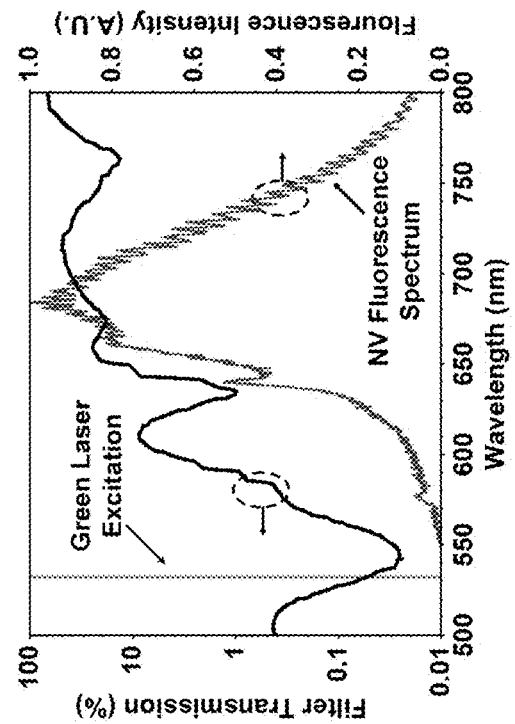
Figure 11D:
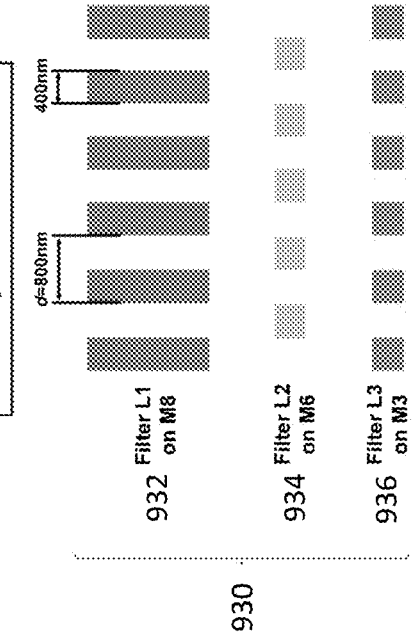

FIGS. 11C and 11D show results of an FDTD simulation for the wire array's performance as a filter. The pitch in each sub-array of the wire array 930 is taken to be 800 nm as shown in FIG. 11B. The aforementioned current-driven wires 932a and 932b plus the interleaved dummy wires 932c in the first sub-array 932 (layer M8) form the first photonic filter layer. The spin-dependent red fluorescence is detected by the photodiode 940 below the optical filter 930. The photodiode's active area is taken to be 80 μm×300 μm and its responsivity is taken to be 188 mA/W.

FIG. 11C shows the simulated transmission for red light (left) and green light (right). FIG. 11D is a plot of the simulated transmission (left axis) and fluorescence intensity (right axis) versus wavelength. It shows that transmission through the filter is 45% for red light and 0.05% for green light for a suppression of about 30 dB, compared to a suppression of about 10 dB for the single-layer grating 230 in the sensor 200 of FIG. 2.

Figure 12A:
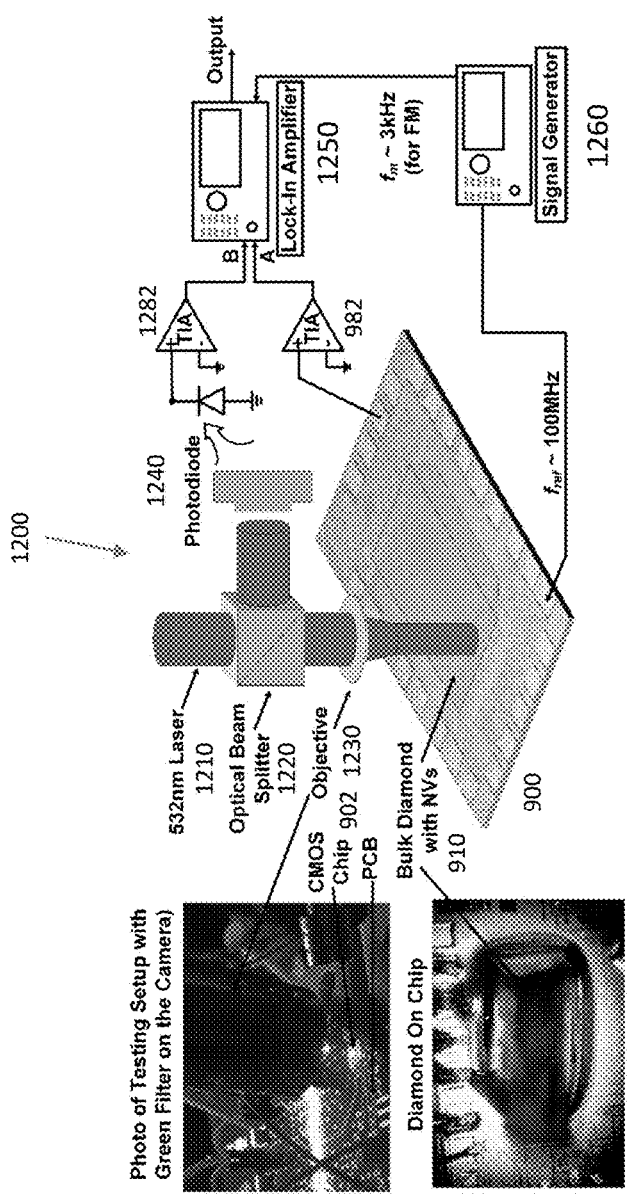
FIG. 12A illustrates a setup for testing the NV-based CMOS magnetometer of FIG. 9.
Figure 12C:
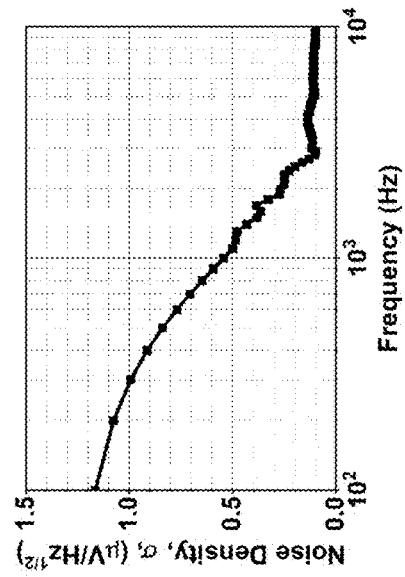
FIG. 12C is a plot of the measured noise floor of the setup of FIG. 12A.
Figure 12B:
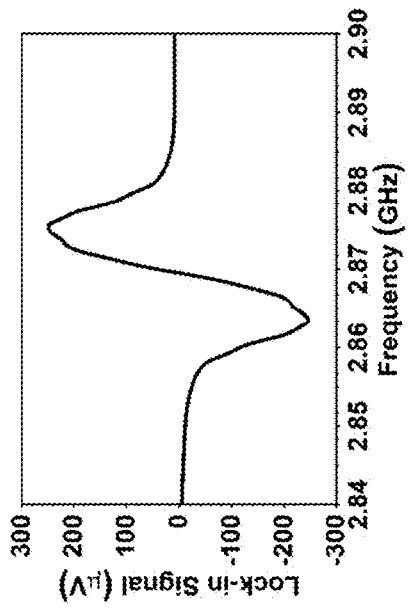
FIG. 12B is a measured ODMR spectrum acquired using the setup of FIG. 12A with no external magnetic field.

FIGS. 12A-12C illustrate a setup 1200 and measurements with an integrated quantum sensor 900 made using 65 nm CMOS technology. The sensor chip 902 has a die area of 1.5 mm² and consumes 40 mW of power in the experiments. A bulk diamond 910 is placed on the chip surface. A cut or facet in the diamond's corner directs light 901 from a vertically oriented green laser 1210 horizontally. This enhances the overall green rejection. For more information on coupling light into an NV-doped diamond via a facet, see U.S. Pre-Grant Publication No. 2015/0192532 to Clevenson et al., which is incorporated herein by reference in its entirety.

The beam from the green laser 1210 (λ=532 nm) is collimated and coupled into the diamond 910 to excite the NV centers embedded in the diamond. The upper left inset of FIG. 12A shows a photo of the setup 1200 with green filter on the camera to show the diamond's red fluorescence. The fluorescence collected by the integrated photodiode 940 (FIG. 9) is measured by a lock-in amplifier 1250 via a TIA 982, which converts the photocurrent from the on-chip photodiode 940 into a voltage. To filter the experimental noise, a frequency-modulated (FM) spectroscopy approach is adopted, in which the instantaneous microwave frequency (2.87 GHz) of the chip 902 changes with a deviation of 6 MHz at a repetition rate of 3 kHz. In other words, the instantaneous microwave frequency swings between 2.864 GHz and 2.876 GHz at a rate of 3 kHz.

In addition, the setup 1200 makes a differential measurement to cancel the amplitude variations in the green laser's output. A beam splitter 1220 between the laser 1210 and the sensor 900 diverts a portion of the green laser beam to an off-chip photodiode 1240, which generates a photocurrent whose amplitude is proportional to the detected intensity. Another TIA 1282 converts this photocurrent into a voltage that is measured by the lock-in amplifier 1250, which produces an output equal to the difference between the voltages supplied by the TIAs 982 and 1282.

Figure 1A:
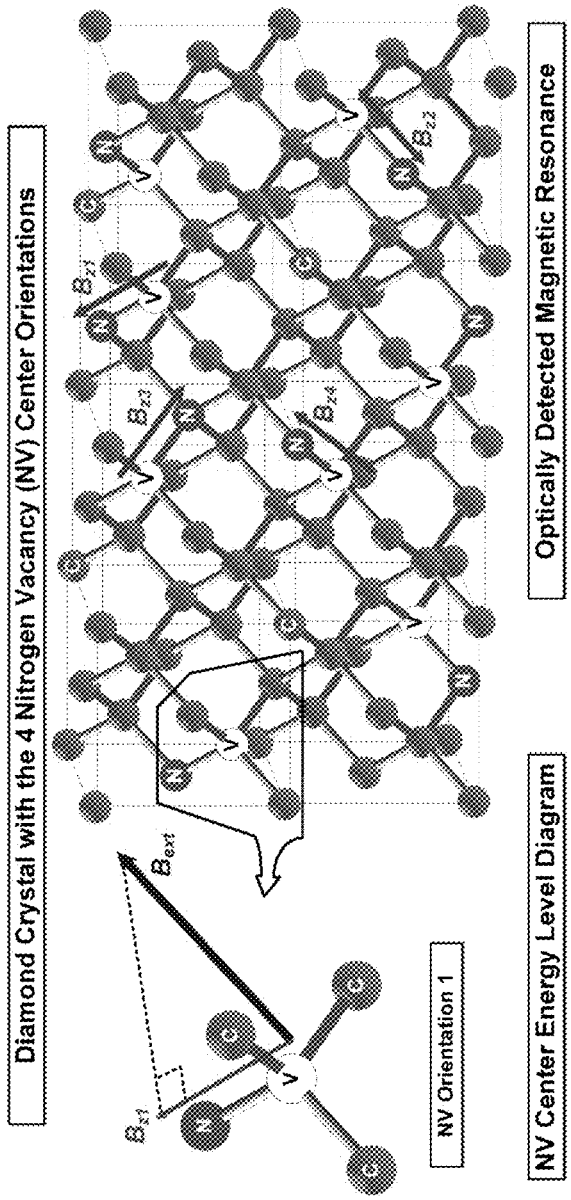
FIG. 1A shows a diamond lattice structure with nitrogen vacancy (NV) centers.
Figure 1C:
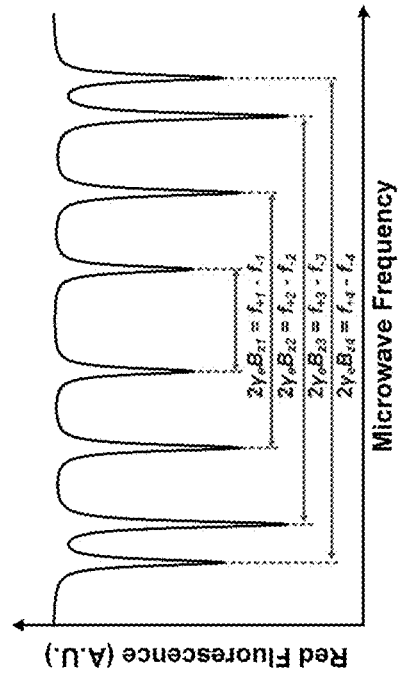
FIG. 1C is a plot of an optically detected magnetic resonance (ODMR) spectrum for NV centers in diamond under a bias magnetic field.
Figure 1B:
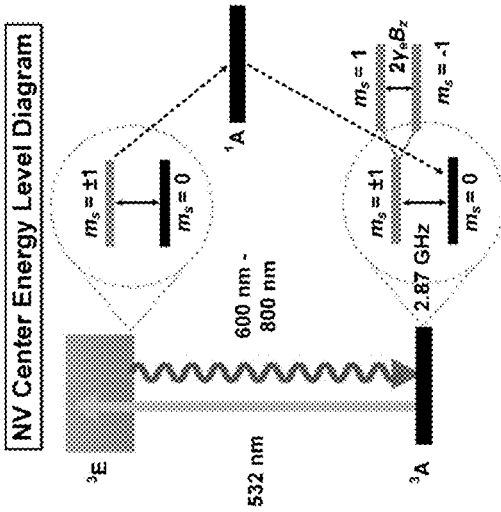
FIG. 1B is an energy level diagram of an NV center in diamond.

A signal source 1260 provides both the frequency-modulated clock of the PLL and the 3 kHz reference to the lock-in amplifier 1250. The lineshape of the measured ODMR is then close to the first-order derivative of the resonances shown in FIG. 1C. First, without applying an external magnetic field, a strong spin resonance is detected at PLL output frequency of 2.87 GHz as shown in FIG. 12B. Then, the noise floor of the sensor 900 (σ) is measured as shown in FIG. 12C. Beyond the corner frequency of 3 kHz, the sensor white noise is about 0.1 μV/√Hz.

Figure 13:
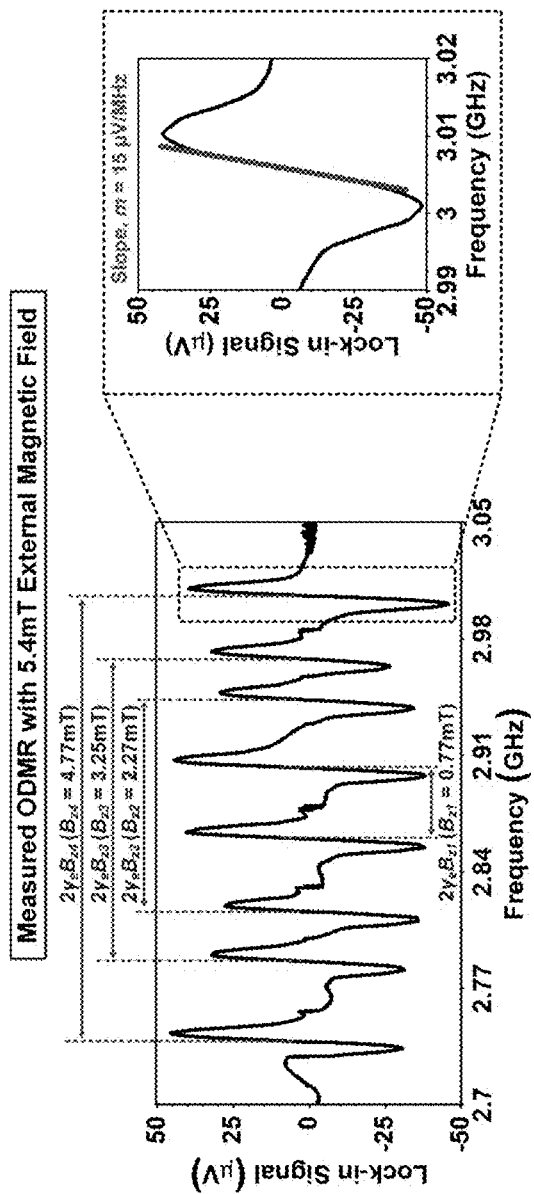
FIG. 13 is a measured ODMR spectrum acquired using the setup of FIG. 12A with an external magnetic field of 5.4 mT.

FIG. 13 is a plot of the ODMR spectrum acquired by the sensor 900 when a magnet is placed near the sensor 900. The magnet generates a magnetic field of about 5.4 mT, which produces four pairs of ODMR dips. These four pairs of ODMR dips correspond to the four diamond crystal orientations with respect to the magnetic field. The output signal is reduced due to the breaking of the degeneracy of the resonances. This break in the degeneracy allows each NV spin population in the diamond layer 910 to be driven separately. Lastly, the vector-field sensitivity, calculated using the slope of the ODMR curve, m, the measured noise floor, and the constant $\gamma_e$, is estimated at 245 nT/√Hz.

These measurements show that the integrated NV-based sensor 900 has a sensitivity that is three orders of magnitude smaller than the sensitivity (73 μT/√Hz) of previous CMOS-diamond quantum sensors, while also providing vector-field detection. The current-driven microwave array and photonic filter designs are readily scalable to larger areas for further improvements in sensitivity or to larger numbers of detectors for gradient magnetometry, multiplexed analytical NMR spectroscopy, and other applications.

3 INTEGRATED ARRAYS OF QUANTUM SPIN MAGNETOMETERS FOR MAGNETIC FIELD IMAGING

Figure 14:
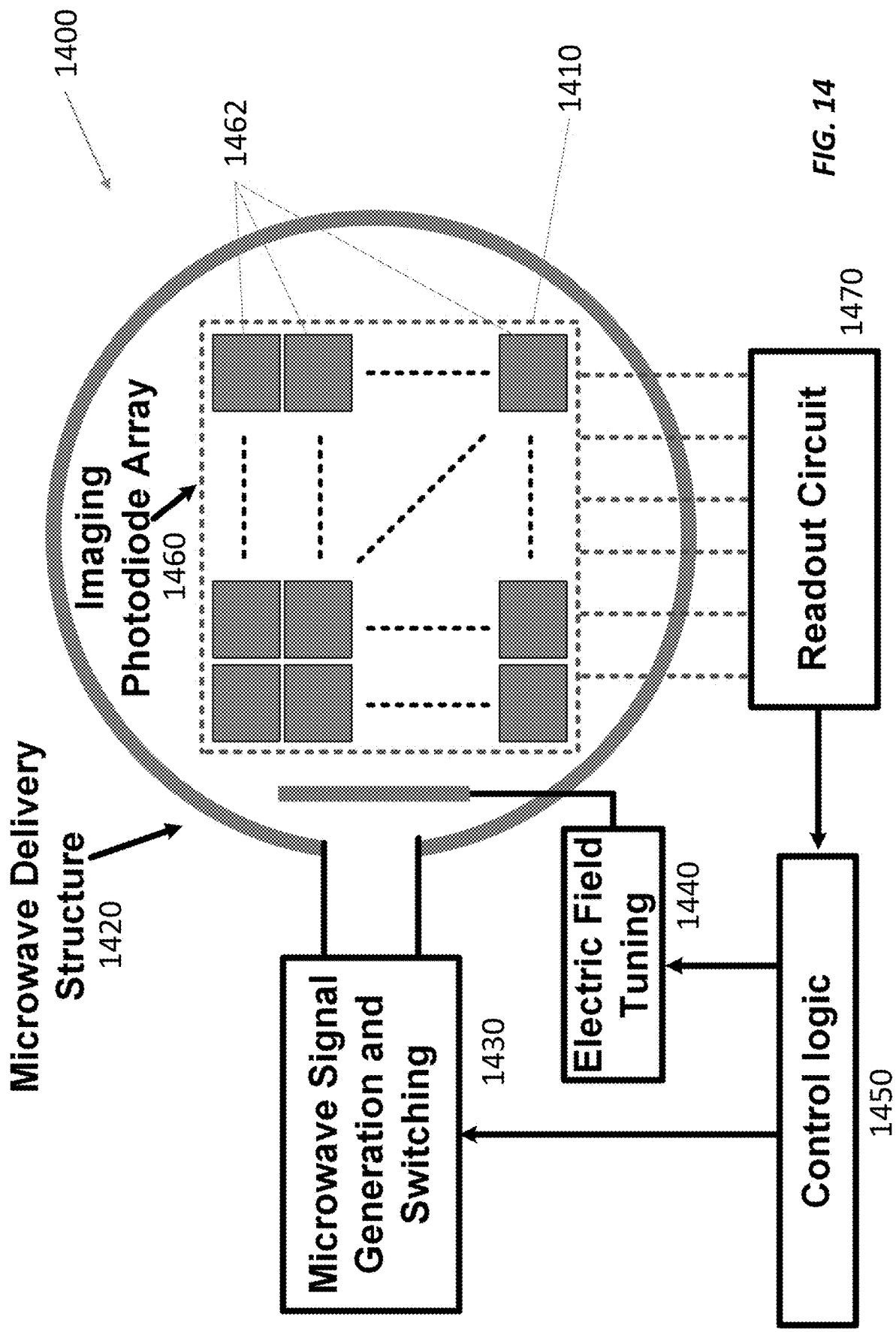
FIG. 14 shows an integrated NV-based magnetic imager with an array of NV-based pixels in a single microwave delivery structure.

FIG. 14 shows an integrated quantum spin magnetic imager 1400 with an imaging array 1460 of NV-based pixels addressed by a single microwave delivery structure 1420 (e.g., an inductor or a wire array). The magnetic imager 1400 can be used for nuclear magnetic resonance (NMR) imaging of unknown liquids or other substances on or close to the imaging array 1460, which includes a solid-state host 1410 doped with color centers, such as an NV-doped nanodiamond layer or an NV-doped bulk diamond. The solid-state host 1410 is on a (two-dimensional) array of photodetectors 1462. These photodetectors 1462 can be implemented as a CMOS array, Geiger-mode avalanche photodiode array, or other suitable array of sensing elements. If desired, the magnetic imager 1400 may include a plasmonic/Talbot-effect filter between the solid-state host 1410 and the photodetectors 1462 to reject the (green) light that excites the color centers. If the microwave delivery structure 1420 includes a wire array, the wire array may also function as a filter as described above.

Microwave signal generation and switching circuitry 1430 drives the microwave delivery structure 1420 with chirped pulses or other waveforms that excites the color centers. The color centers respond to this microwave excitation and optical excitation by emitting fluorescent light, which is detected by the photodetectors 1462. A readout circuit 1470 reads out the photodetectors 1462 to produce an image-like representation or map of the magnet field experienced by the color centers. The spatial resolution of this map depends on the pitch of the photodetectors 1462 in the imaging array. Control logic 1450 coupled to the readout circuit 1470 and the microwave signal generation and switching circuitry 1430 synchronizes the pixel read out with the microwave pulse excitation. The control logic 1450 can provide closed-loop feedback between the spin manipulation and readout. An electric field tuning circuit 1440 coupled to the control logic 1450 can tune the NV zero phonon line for quantum information applications.

Figure 15:
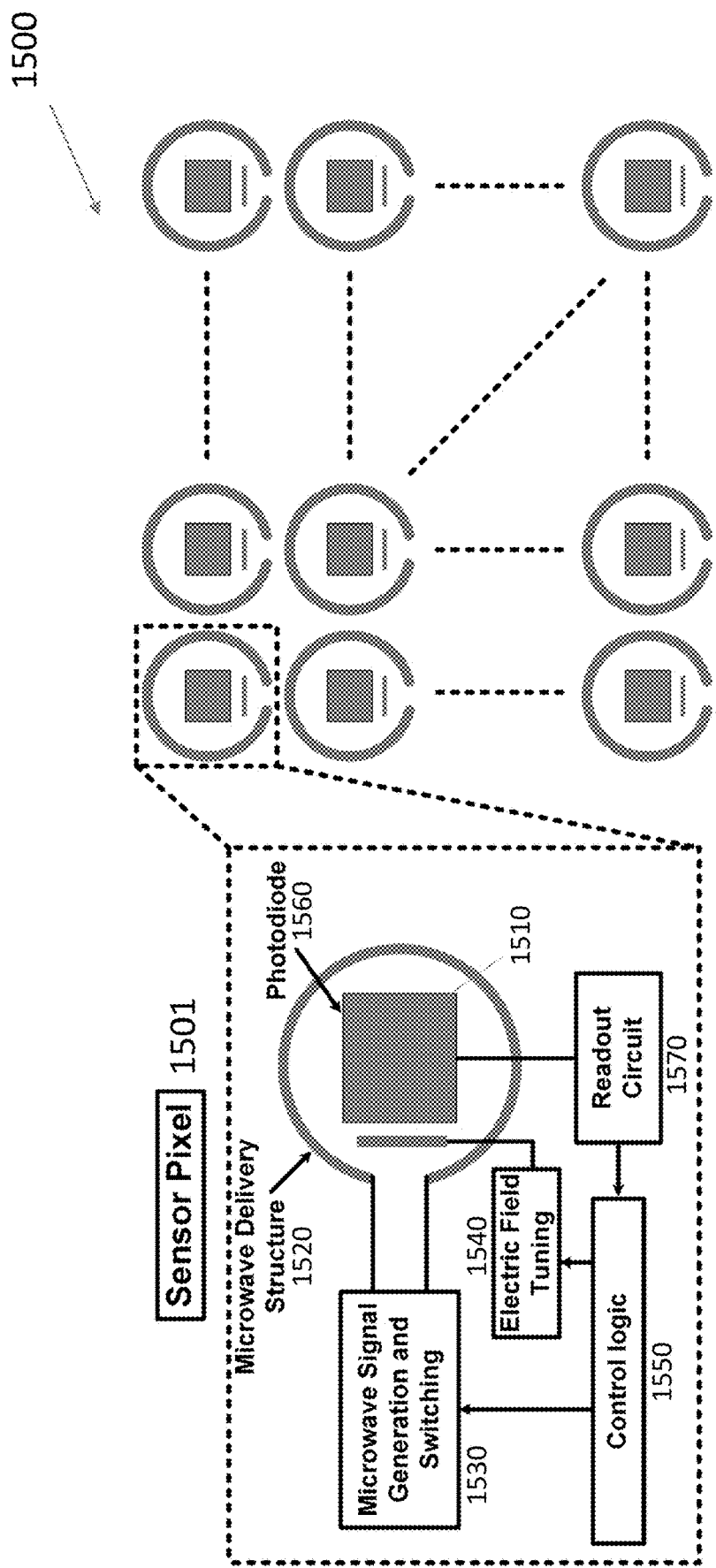
FIG. 15 shows magnetometer with an array of NV-based pixels, each with its own microwave delivery structure.

FIG. 15 shows an array 1500 of individually addressed integrated quantum spin magnetometers 1501. Each magnetometer 1501 may function as a unit cell of a quantum information processor or quantum repeater. Alternatively, the array 1500 can be used for quantum sensing, where each individually addressable quantum spin senses at a particular magnetic field frequency. The array 1500 can also function as a magnetic spectrometer that monitors multiple magnetic field frequencies simultaneously for object detection and tracking.

Each magnetometer 1501 in the array 1500 has its own solid-state host 1510 doped with color centers, microwave delivery structure 1520 (loop or wire array), microwave signal generation and switching circuitry 1530, electric field tuning circuitry 1540, control logic 1550, photodiode 1460, and readout circuit 1570. And each magnetometer 1501 can include a filter (not shown) like the filter 930 in FIGS. 9 and 11A-11D.

Like the magnet imager 1400 in FIG. 14, the magnetometer array 1500 in FIG. 15 produces a map of a magnetic field. However, because each pixel 1501 in the magnetometer array 1500 has its own microwave delivery structure 1520 and circuitry 1530, each pixel 1501 can be triggered and read individually. Because each unit cell 1501 is addressed by its own microwave signal, each unit cell's gain or sensitivity can be adjusted individually, e.g., by changing the applied microwave signal.

4 AN INTEGRATED SPIN-BASED QUANTUM MEMORY

Figure 16:
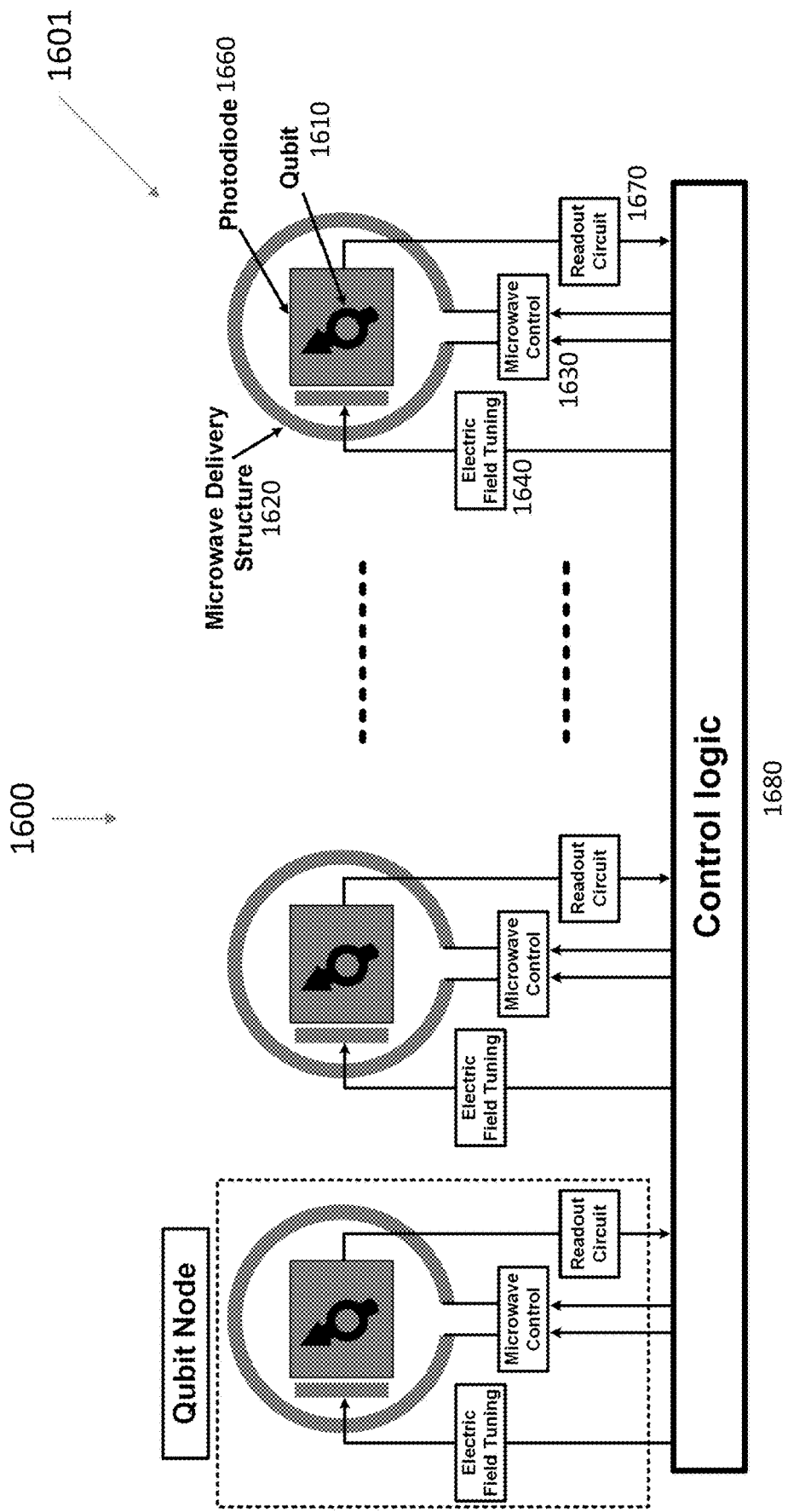
FIG. 16 illustrates a memory with integrated NV-based qubit storage nodes for quantum information processing or a quantum repeater.

FIG. 16 shows a memory 1600 for a quantum memory or quantum repeater. The memory 1600 includes many qubit storage cells 1601, each of which includes one or more color centers in a crystal host (e.g., NV centers in diamond) 1610, a microwave delivery structure 1620 (e.g., a (broken) loop inductor or wire array), and a photodetector 1660 (e.g., an avalanche photodiode). Microwave control circuitry 1630 and field tuning electronics 1640 control the microwave delivery structure 1620, and a readout circuit 1670 processes signals from the photodetector 1660. The electronics in each qubit storage cell 1601 are coupled to control logic 1680, which may include CMOS classical logic gates to process the information measured by the photodetector 1660 and apply feedback with the inductor 1620 and microwave control 1630.

In operation, the NV centers in each qubit storage cell 1601 can be initialized in a particular qubit state by optical pumping (e.g., with a green laser beam from a green laser, not shown) and manipulated by resonant optical fields from a laser and/or resonant microwave fields delivered by the microwave delivery structures 1620. Optical transition frequencies are tuned by a DC electric field (through the DC Stark effect) provided by the field tuning electronics 1640 to make emitted photons indistinguishable. This tuning can be accomplished with several wires around each qubit storage cell 1601 with voltage differentials applied across them. These voltage differences generate an electric field which Stark tunes the zero-phonon line of the NV centers.

Qubit states are initialized by an optical pump beam (e.g., a green laser beam) and manipulated by resonant microwave fields or resonant optical fields. Quantum gates between multiple qubits can be provided from (i) microwave-assisted spin-spin interaction and (ii) laser-assisted photon interference. The states can be read by (i) repetitive quantum non-demolition measurements by driving cycling resonant optical transitions, (ii) spin-dependent fluorescence detection (using ODMR), or (iii) spin-to charge-state conversion.

Entanglements between qubits can be produced with (i) microwave-assisted spin-spin interaction or (ii) projecting locally created spin-photon entanglements to distant NV centers by joint photon measurements. The NV states can be read by (i) spin-dependent fluorescence detection, (ii) repetitive quantum non-demolition measurements by driving cycling resonant optical transitions, or (iii) spin-to charge-state conversion. The memory 1600 can also include CMOS classical logic gates to process the information measured by the photodetector 1660 and apply feedback and/or quantum error corrections with the inductor and electric field source.

5 CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus for measuring an external magnetic field, the apparatus comprising:
    a semiconductor integrated circuit comprising a plurality of metal layers;
    a crystal host disposed on the semiconductor integrated circuit and comprising a plurality of color centers;
    an inductor, comprising a multi-turn metal loop formed in a first metal layer in the plurality of metal layers of the semiconductor integrated circuit, to apply an alternating current (AC) magnetic field to the plurality of color centers;
    a photodetector, integrated in the semiconductor integrated circuit in optical communication with the plurality of color centers and inside a perimeter of the inductor, to detect fluorescence emitted by the plurality of color centers in response to the external magnetic field; and
    a filter, formed in a second metal layer in the plurality of metal layers of the semiconductor integrated circuit between the plurality of color centers and the photodetector, to transmit the fluorescence to the photodetector and block light at other wavelengths.

2. The apparatus of claim 1, wherein the crystal host comprises a diamond and the plurality of color centers comprises a plurality of nitrogen vacancies.

3. The apparatus of claim 1, wherein the multi-turn metal loop comprises at least one parasitic disconnected loop to enhance uniformity of the AC magnetic field.

4. The apparatus of claim 1, wherein the inductor comprises a resonant inductor.

5. The apparatus of claim 4, wherein the photodetector has an active area patterned with trenches to reduce eddy currents caused by the AC magnetic field in the photodetector.

6. The apparatus of claim 1, wherein the photodetector comprises a plurality of photodiodes, the plurality of photodiodes comprising:
    a first photodiode having a first anode and a first cathode; and
    a second photodiode having a second anode in electrical communication with the first anode and a second cathode in electrical communication with the first cathode.

7. The apparatus of claim 1, further comprising:
    a signal generator, integrated in the semiconductor integrated circuit and operably coupled to the inductor, to drive the inductor with a current that induces the AC magnetic field.

8. The apparatus of claim 1, further comprising:
    circuitry, formed in the semiconductor integrated circuit, to process a signal emitted by the photodetector in response to the fluorescence.

9. The apparatus of claim 1, further comprising:
    a light source, in optical communication with the plurality of color centers, to excite the plurality of color centers with light.

10. An apparatus for measuring an external magnetic field, the apparatus comprising:
    a complementary metal-oxide-semiconductor (CMOS) integrated circuit;
    a solid-state host disposed on the CMOS integrated circuit and comprising a plurality of color centers;
    an inductor formed in at least one layer of the CMOS integrated circuit, the inductor comprising at least one parasitic disconnected loop;
    a signal generator, integrated in the CMOS integrated circuit in electrical communication with the inductor, to apply a current to the inductor, the current inducing an alternating current (AC) magnetic field in the resonant inductor across the plurality of nitrogen vacancies; and
    a photodetector, integrated in the CMOS integrated circuit in optical communication with the plurality of color centers and patterned to reduce eddy currents, to detect fluorescence emitted by the plurality of color centers in response to the external magnetic field.

11. The apparatus of claim 10, wherein the at least one parasitic disconnected loop increases a uniformity of the AC magnetic field.

12. A magnetometer comprising:
an integrated circuit;
an array of magnetic field sensors disposed on the integrated circuit, each magnetic field sensor in the array of magnetic field sensors comprising:
a crystal host comprising color centers;
an inductor, formed in at least one layer of the integrated circuit around the crystal host, to apply an alternating current (AC) magnetic field to the color centers; and
a photodetector, in optical communication with the color centers, to detect fluorescence emitted by the color centers in response to an external magnetic field,
wherein each magnetic field sensor in the array of magnetic field sensors is configured to be triggered and read individually, and
wherein each magnetic field sensor in the array of magnetic field sensors has at least one of a gain or sensitivity that is adjustable independently of gains or sensitivities of other magnetic field sensor in the array of magnetic field sensors.

13. The magnetometer of claim 12, further comprising:
circuitry, formed in the integrated circuit, to process a signal emitted by the photodetector in response to the fluorescence.

14. An apparatus for measuring an external magnetic field, the apparatus comprising:
a semiconductor integrated circuit;
a crystal host disposed on the semiconductor integrated circuit and comprising color centers to emit fluorescence in response to the external magnetic field;
an array of metal wires, formed in a layer of the semiconductor integrated circuit, to apply an alternating current (AC) magnetic field to the color centers, the array of metal wires forming a metal grating to transmit the fluorescence and filter light at other wavelengths; and
a photodetector, integrated in the semiconductor integrated circuit in optical communication with the color centers and the array of wires, to detect the fluorescence.

15. The apparatus of claim 14, wherein the array of metal wires comprises current-carrying wires to carry alternating current that induces the AC magnetic field and non-current-carrying wires.

16. The apparatus of claim 15, wherein the metal grating is a first metal grating, having a first grating period, in a first layer of the semiconductor integrated circuit and further comprising:
a second metal grating, having a second grating period equal to the first grating period, in a second layer of the semiconductor integrated circuit, wherein the second metal grating is laterally offset from the first metal grating by about half the first grating period.

17. The apparatus of claim 16, wherein the semiconductor integrated circuit is a complementary metal-oxide-semiconductor (CMOS) integrated circuit, the first layer is an M8 layer of the CMOS integrated circuit, the second layer is an M6 layer of the CMOS integrated circuit, and further comprising
a third metal grating, having a third grating period equal to the first grating period and the second grating period, in an M3 layer of the CMOS integrated circuit.

18. The apparatus of claim 17, further comprising:
an AC current source, in electrical communication with the array of wires, to apply the alternating current to the current-carrying wires with a non-uniform distribution selected to induce the AC magnetic field with a uniform amplitude across the color centers.

19. A memory for a quantum computer or quantum repeater, the memory comprising:
an integrated circuit;
an array of qubit storage nodes disposed on the integrated circuit, each qubit storage node in the array of qubit storage nodes comprising:
a crystal host comprising color centers;
an inductor, formed in at least one layer of the integrated circuit around the crystal host, to apply an alternating current (AC) magnetic field to the color centers;
an electric field source, formed in at least one layer of the integrated circuit in electromagnetic communication with the crystal host, to apply an electric field to the color centers; and
a photodetector, in optical communication with the color centers, to detect fluorescence emitted by the color centers in response to the AC magnetic field and/or the electric field.

\* \* \* \* \*